(12) United States Patent
Gates, Jr. et al.

(10) Patent No.: US 7,455,918 B2
(45) Date of Patent: Nov. 25, 2008

(54) ALUMINA COATING, COATED PRODUCT AND METHOD OF MAKING THE SAME

(75) Inventors: Alfred S. Gates, Jr., Greensburg, PA (US); Pankaj K. Mehrotra, Greensburg, PA (US); Charles G. McNerny, Greensburg, PA (US); Peter R. Leicht, Latrobe, PA (US)

(73) Assignee: Kennametal Inc., Latrobe, PA (US)

( * ) Notice: Subject to any disclaimer, the term of this patent is extended or adjusted under 35 U.S.C. 154(b) by 184 days.

(21) Appl. No.: 10/799,827

(22) Filed: Mar. 12, 2004

(65) Prior Publication Data

US 2005/0202283 A1    Sep. 15, 2005

(51) Int. Cl.
B32B 9/00    (2006.01)

(52) U.S. Cl. .......................... 428/701; 51/307; 51/309; 428/698; 428/702

(58) Field of Classification Search ................ 51/307, 51/309; 428/701, 702, 698
See application file for complete search history.

(56) References Cited

U.S. PATENT DOCUMENTS

| | | | |
|---|---|---|---|
| 4,720,437 A | 1/1988 | Chudo et al. |
| 4,746,563 A | 5/1988 | Nakano et al. |
| 4,751,109 A | 6/1988 | Sarin et al. |
| 4,966,501 A | 10/1990 | Nomura et al. |
| 5,071,696 A | 12/1991 | Chatfield et al. |
| 5,135,801 A | 8/1992 | Nystrom et al. |
| 5,137,774 A | 8/1992 | Ruppi |
| 5,162,147 A | 11/1992 | Ruppi |
| 5,296,016 A | 3/1994 | Yoshimura et al. |
| 5,330,553 A | 7/1994 | Weinl et al. |
| 5,330,853 A | 7/1994 | Hofmann et al. |
| 5,372,873 A | 12/1994 | Yoshimura et al. |
| 5,374,471 A | 12/1994 | Yoshimura et al. |
| 5,436,071 A | 7/1995 | Odani et al. |
| 5,487,625 A | 1/1996 | Ljungberg et al. |
| 5,516,588 A | 5/1996 | van den Berg et al. |
| 5,545,490 A | 8/1996 | Oshika |
| 5,549,975 A | 8/1996 | Schulz et al. |

(Continued)

FOREIGN PATENT DOCUMENTS

EP    0 247 630 A2    12/1987

(Continued)

OTHER PUBLICATIONS

S. Ruppi et al, "Chemical Vapour Deposition of K-Al2-O3", Thin Solid Films 388 (2001) pp. 50-61.

(Continued)

*Primary Examiner*—Archene Turner
(74) *Attorney, Agent, or Firm*—John J. Prizzi

(57) ABSTRACT

A coated body that includes a substrate and a coating scheme on the substrate. The coating scheme on the substrate wherein the coating scheme includes an alpha-alumina coating layer that exhibits a platelet grain morphology at the surface of the alpha-alumina coating layer or a kappa-alumina coating layer that exhibits either a lenticular grain morphology or a polyhedra-lenticular grain morphology at the surface thereof or an alpha-kappa-alumina coating layer that exhibits either a large multifaceted grain morphology or a polyhedra-multifaceted grain morphology at the surface thereof.

26 Claims, 13 Drawing Sheets
(1 of 13 Drawing Sheet(s) Filed in Color)

U.S. PATENT DOCUMENTS

| | | | |
|---|---|---|---|
| 5,576,093 | A | 11/1996 | Yoshimura et al. |
| 5,587,233 | A | 12/1996 | Konig et al. |
| 5,589,223 | A | 12/1996 | Odani et al. |
| 5,597,272 | A | 1/1997 | Moriguchi et al. |
| 5,635,247 | A | 6/1997 | Ruppi |
| 5,652,045 | A | 7/1997 | Nakamura et al. |
| 5,654,035 | A | 8/1997 | Ljungberg et al. |
| 5,665,431 | A | 9/1997 | Narasimhan |
| 5,674,564 | A | 10/1997 | Ljungberg et al. |
| 5,681,651 | A | 10/1997 | Yoshimura et al. |
| 5,693,408 | A | 12/1997 | van den Berg et al. |
| 5,700,569 | A | 12/1997 | Ruppi |
| 5,702,808 | A | 12/1997 | Ljungberg |
| 5,705,263 | A | 1/1998 | Lenander et al. |
| 5,766,782 | A | 6/1998 | Ljungberg |
| 5,770,261 | A | 6/1998 | Nakamura et al. |
| 5,776,588 | A | 7/1998 | Moriguchi et al. |
| 5,786,069 | A | 7/1998 | Ljungberg et al. |
| 5,800,868 | A | 9/1998 | Lenander et al. |
| 5,834,061 | A | 11/1998 | Ljungberg |
| 5,851,687 | A | 12/1998 | Ljungberg |
| 5,861,210 | A | 1/1999 | Lenander et al. |
| 5,863,640 | A | 1/1999 | Ljungberg et al. |
| 5,869,147 | A | 2/1999 | Konig |
| 5,871,850 | A | 2/1999 | Moriguchi et al. |
| 5,902,671 | A | 5/1999 | Kutscher |
| 5,912,051 | A | 6/1999 | Olsson et al. |
| 5,915,162 | A | 6/1999 | Uchino et al. |
| 5,920,760 | A | 7/1999 | Yoshimura et al. |
| 5,942,318 | A | 8/1999 | Soderberg et al. |
| 5,945,207 | A | 8/1999 | Kutscher et al. |
| 5,958,569 | A | 9/1999 | Leverenz et al. |
| 5,968,595 | A | 10/1999 | Kutscher |
| 5,972,495 | A | 10/1999 | Ishii et al. |
| 5,980,988 | A | 11/1999 | Ljungberg |
| 5,985,427 | A | 11/1999 | Ueda et al. |
| 6,007,909 | A | 12/1999 | Rolander et al. |
| 6,015,614 | A | 1/2000 | Ruppi |
| 6,056,999 | A | 5/2000 | Narasimhan |
| 6,062,776 | A | 5/2000 | Sandman et al. |
| 6,071,601 | A | 6/2000 | Oshika et al. |
| 6,090,476 | A | 7/2000 | Thysell et al. |
| 6,093,479 | A | 7/2000 | Yoshimura et al. |
| 6,139,921 | A | 10/2000 | Taschner et al. |
| 6,156,383 | A | 12/2000 | Ishii et al. |
| 6,177,178 | B1 | 1/2001 | Ostlund et al. |
| 6,183,846 | B1 | 2/2001 | Moriguchi et al. |
| 6,187,421 | B1 | 2/2001 | Moriguchi et al. |
| 6,200,671 | B1 | 3/2001 | Lindskog et al. |
| 6,207,262 | B1 | 3/2001 | Ichikawa et al. |
| 6,221,469 | B1 | 4/2001 | Ruppi |
| 6,251,508 | B1 | 6/2001 | Ruppi |
| 6,261,673 | B1 | 7/2001 | Reineck et al. |
| 6,274,249 | B1 | 8/2001 | Braendle et al. |
| 6,284,356 | B1 | 9/2001 | Kiriyama |
| 6,293,739 | B1 | 9/2001 | Uchino et al. |
| 6,333,098 | B1 | 12/2001 | Olsson et al. |
| 6,333,103 | B1 | 12/2001 | Ishii et al. |
| 6,338,894 | B1 | 1/2002 | Hirakawa et al. |
| 6,379,798 | B1 | 4/2002 | Yazaki |
| 6,383,624 | B1 | 5/2002 | Soderberg et al. |
| 6,406,224 | B1 | 6/2002 | Ostlund et al. |
| 6,413,628 | B1 | 7/2002 | Narasimhan |
| 6,426,137 | B1 | 7/2002 | Oshika et al. |
| 6,436,519 | B2 | 8/2002 | Holzschun |
| 6,472,060 | B1 | 10/2002 | Ruppi et al. |
| 6,565,957 | B2 * | 5/2003 | Nakamura et al. ......... 428/701 |
| 6,599,062 | B1 | 7/2003 | Oles et al. |
| 6,617,058 | B2 | 9/2003 | Schier |
| 6,620,498 | B2 | 9/2003 | Ruppi et al. |
| 6,627,335 | B2 | 9/2003 | Kodama et al. |
| 6,638,609 | B2 | 10/2003 | Nordgren et al. |
| 6,689,450 | B2 * | 2/2004 | Ruppi ........................ 428/702 |
| 7,163,735 | B2 * | 1/2007 | Ruppi ........................ 428/698 |
| 2002/0086147 | A1 | 7/2002 | Hirakawa et al. |
| 2002/0176755 | A1 | 11/2002 | Ruppi |

FOREIGN PATENT DOCUMENTS

| | | |
|---|---|---|
| EP | 0 196 201 B2 | 10/1991 |
| EP | 0 149 024 B2 | 3/1993 |
| EP | 0 263 747 B1 | 8/1993 |
| EP | 0 686 707 A1 | 12/1995 |
| EP | 0 709 484 A1 | 5/1996 |
| EP | 0 600 115 B1 | 10/1996 |
| EP | 0 594 875 B1 | 3/1997 |
| EP | 0 786 536 A1 | 7/1997 |
| EP | 0 878 563 A1 | 11/1998 |
| EP | 0 900 860 A2 | 3/1999 |
| EP | 0 678 594 B1 | 5/1999 |
| EP | 0 492 059 B1 | 7/2000 |
| EP | 0 685 572 B1 | 7/2000 |
| EP | 0 732 423 B1 | 6/2001 |
| EP | 1 118 688 A1 | 7/2001 |
| EP | 1 122 334 A1 | 8/2001 |
| EP | 0 878 563 B1 | 10/2001 |
| EP | 1 160 353 A1 | 12/2001 |
| EP | 1 209 255 A2 | 5/2002 |
| EP | 1 245 698 A2 | 10/2002 |
| EP | 1 245 700 A1 | 10/2002 |

OTHER PUBLICATIONS

Colombier et al., "Formation of Mixed TiC/Al2O3 Layers and alpha- and kappa-Al2O3 on Cemented Carbides by Chemical Vapour Deposition", Jr. of Mat. Sci, 24 (1989) pp. 462-470.

T. Schmitt et al., "Influence of Temperature and Substrate On Al2O3 CVC From AlCl3/M2/CO2 Gas Mixtures" XP-000874742 P.d. (1983) pp. 421-427.

Yi-Feng Su et al., "Effects of an Electroplated Platinum Interlayer on the Morphology and Phases of Chemically-Vapor-Deposited Alumina on Single-Crystal, Nickel-Based Superalloy" J. Am. Cer. Soc. 85 (8) (2002) pp. 2089-2096.

Abstract of Yi-Feng Su et al., "Effects of an Electroplated Platinum Interlayer on the Morphology and Phases of Chemically-Vapor-Deposited Alumina on Single-Crystal, Nickel-Based Superalloy" J. Am. Cer. Soc. 85 (8) (2002) (2 pgs.).

International Search Report, International Patent Application No. PCT/US2005/008012.

Written Opinion of the International Searching Authority, International Patent Application No. PCT/US2005/008012.

Notification of Transmittal of the International Search Report and the Written Opinion of the Int'l Searching Authority of Int'l Patent Application No. PCT/US2005/008012.

International Preliminary Report on Patentability for PCT/US2005/008012 mailed May 12, 2006 (5 pages).

Vuorinen et al., "Characterization of a-Al2O3, k-Al2O3, and a-k multioxide Coatings on Cemented Carbide", Thin Solid Films 193/194 (1990) pp. 536-546.

Halvarsson et al., "Microstructure and performanc of CVD k-Al2O3 multilayers", Materials Science and Engineering A209 (1996) pp. 337-344.

* cited by examiner

ALUMINA COATING, COATED PRODUCT AND METHOD OF MAKING THE SAME

BACKGROUND OF THE INVENTION

The present invention pertains to an alumina coating and coated products, especially coated cutting inserts that are useful in material removal applications such as, for example, machining, turning, and milling. More specifically, the present invention pertains to a coated cutting insert wherein the coating includes a coating layer of alpha-alumina or kappa-alumina or a mixture of alpha and kappa-alumina, and methods of making the coating and the coated cutting insert.

Heretofore, coated cutting inserts have been used in material removal applications. The coating layers typically comprise hard refractory materials that exhibit the property of wear resistance. One primary purpose of using a coating on a cutting insert has been to lengthen the useful life of the cutting insert. Examples of such coating schemes wherein the coating scheme includes a coating layer of alumina are disclosed in a number of patent documents wherein exemplary ones of these patent documents are described hereinafter.

U.S. Pat. No. 6,156,383 to Ishii et al. seems to appreciate that it would be beneficial to have an oxidized layer upon which to deposit the $\alpha$-alumina layer. U.S. Pat. No. 4,720,437 to Chudo et al. mentions that TiCO or TiCNO can improve the bonding of an alumina layer.

U.S. Pat. No. 5,770,261 to Nakamura et al. appears to show the deposition at 900° C. of alumina onto a TiCNO layer and a TiCO layer. The U.S. '261 Patent appears to show a multilayer coating scheme. European Patent Application No. 0 900 860 A2 to Mitsubishi Materials Corp. (and U.S. Pat. No. 6,207,262 B1 to Ichikawa et al.) appears to disclose the deposition of TiCO or TiCNO and then the deposition of alumina on either one of these Ti-containing layers. European Patent Application No. 0 786 536 A1 to Mitsubishi Materials Corp. (and U.S. Pat. No. 5,985,427 to Ueda et al.) appears to show an alumina layer applied at 950° C. to a TiCNO layer or a TiCO layer. European Patent Application No. 0 686 707 A1 to Mitsubishi Materials Corp. discloses the CVD deposition of $\chi$-type alumina on a titanium carboxide layer or a titanium oxicarbonitride layer.

European Patent Application No. 1 209 255 A2 to Sandvik AB pertains to a coating scheme wherein an $\alpha$-alumina layer that has equiaxed grains with striated zones containing Ti is deposited on a TiCNO layer. The deposition temperature of the $\alpha$-alumina layer is at about 1000° C.

U.S. Pat. No. 6,093,479 to Yoshimura et al. pertains to a coating scheme that includes alumina deposited on a TiCNO layer or TiCO layer. The alumina appears to be applied at a temperature equal to 850-1000° C., but the alumina is either κ-alumina or a combination of Kappa and alpha alumina wherein kappa content is greater than the alpha content.

European Patent No. 0 247 630 to NGK Spark Plug presents an example in which alumina is deposited over a TiCNO layer. European Patent No. 0 263 747 B1 to Mitsubishi Materials Corp. discloses a coating scheme on a binder enriched substrate. The coating includes alumina deposited on TiCO and TiCNO.

As is apparent from the above documents, many different coating schemes for cutting insert have been used in the past. According to these patent documents, each one of these coating schemes provides certain advantages. Even though there have been coating schemes that are supposed to provide certain advantages, there has always remained a desire to continue to lengthen the useful life, as well as to improve the performance characteristics of the coated cutting inserts.

Thus, it would be highly desirable to provide an improved alumina coating and coated product such as, for example, a coated cutting insert wherein the coating includes a coating layer of alpha-alumina (or kappa-alumina or alpha-kappa alumina) and the cutting insert is useful in material removal applications wherein the cutting insert has a lengthened tool life. It would also be desirable to provide an improved alumina coating and coated product such as, for example, a coated cutting insert wherein the coating includes a coating layer of alpha-alumina (or kappa-alumina or alpha-kappa alumina) and the cutting insert is useful in material removal applications wherein the cutting insert exhibit improved performance characteristics.

SUMMARY OF THE INVENTION

In one form thereof, the invention is a coated body that comprises a substrate, and a coating scheme on the substrate. The coating scheme includes an alpha-alumina coating layer that exhibits a platelet grain morphology at the surface of the alpha-alumina coating layer.

In another form thereof, the invention is a coated body that comprises a substrate. There is a coating scheme on the substrate wherein the coating scheme includes a kappa-alumina coating layer that exhibits either a lenticular grain morphology or a polyhedra-lenticular grain morphology at the surface of the kappa-alumina coating layer.

In yet another form, the invention is a coated body that comprises a substrate. There is a coating scheme on the substrate wherein the coating scheme includes an alumina coating layer that contains alpha-alumina and kappa-alumina, and wherein the coating layer exhibits either a large multifaceted grain morphology or a polyhedra-multifaceted grain morphology at the surface of the alumina coating layer.

In another form thereof, the invention is a coated body that includes a substrate. There is a coating scheme on the substrate wherein the coating scheme includes an alumina coating layer selected from the group comprising an alpha-alumina coating layer and a kappa-alumina coating layer and a kappa-alpha-alumina coating layer, and the coating layer being applied by chemical vapor deposition at a temperature ranging between about 750 degrees Centigrade and about 920 degrees Centigrade.

In still another form, the invention is a method of coating a substrate comprising the steps of: applying by chemical vapor deposition at a temperature ranging between about 750° C. and about 920° C. an alpha-alumina coating layer wherein the alpha-alumina coating layer exhibits a platelet grain morphology at the surface thereof.

In still another form thereof, the invention is a method of coating a substrate comprising the steps of: applying by chemical vapor deposition at a temperature ranging between about 750° C. and about 920° C. a kappa-alumina coating layer wherein the kappa-alumina coating layer exhibits either a lenticular grain morphology or a polyhedra-lenticular grain morphology at the surface thereof.

In another form thereof, the invention is a method of coating a substrate comprising the steps of: applying by chemical vapor deposition at a temperature ranging between about 750° C. and about 920° C. an alpha-kappa-alumina coating layer wherein the alpha-kappa-alumina coating layer exhibits either a large multifaceted grain morphology or a polyhedra-multifaceted grain morphology at the surface thereof.

In yet another form thereof, the invention is a coated body that includes a substrate that comprises polycrystalline cubic boron nitride. There is a coating scheme on the substrate wherein the coating scheme includes an alumina coating layer. The alumina coating layer is one of the following: an alpha-alumina coating layer having a platelet grain morphology at the surface thereof, or a kappa-alumina coating layer having either a lenticular grain morphology at the surface thereof or a polyhedra-lenticular grain morphology at the surface thereof, or an alpha-kappa-alumina coating layer having either a large multifaceted grain morphology at the surface thereof or a polyhedra-multifacted grain morphology at the surface thereof.

BRIEF DESCRIPTION OF THE DRAWINGS

The patent or application file contains at least one drawing executed in color. Copies of this patent with color drawing(s) will be provided by the Patent and Trademark Office upon request and payment of necessary fee.

The following is a brief description of the drawings that, form a part of this patent application.

DETAILED DESCRIPTION OF THE INVENTION

Figure 1:
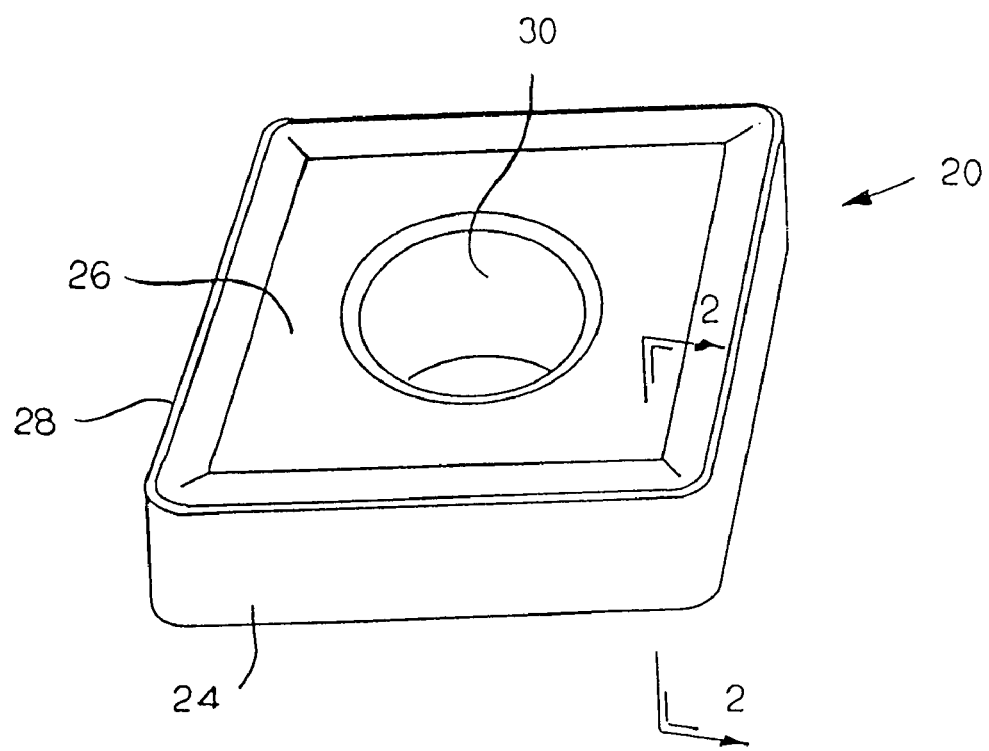
FIG. 1 is an isometric view of a specific embodiment of the coated cutting insert of the present invention wherein the coated cutting insert has a substrate with a coating applied thereto.
Figure 2:
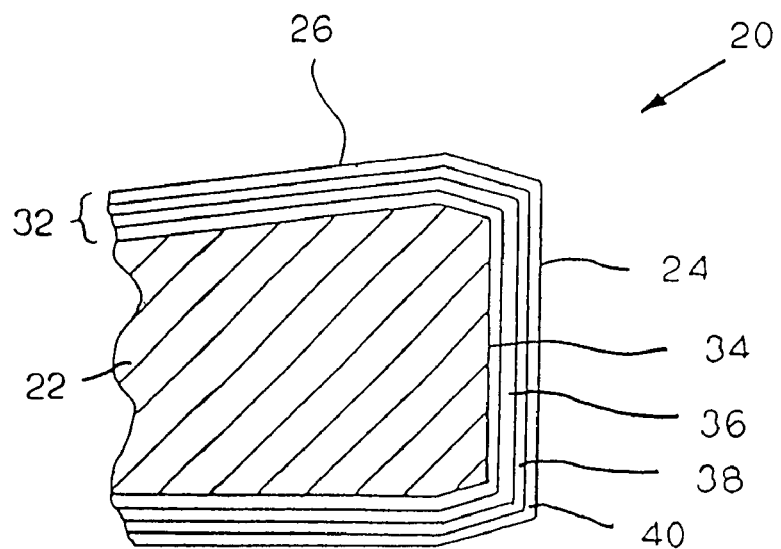
FIG. 2 is a cross-sectional view of the cutting insert of FIG. 1 taken along section line 2-2 of FIG. 1 wherein there is shown one corner of the coated cutting insert.

Referring to the drawings, FIGS. 1 and 2 illustrate a specific embodiment of the invention wherein the coated cutting insert is generally designated as 20. Coated cutting insert 20 comprises a substrate 22. The substrate 22 can be made from any one of a number of substrate materials. Exemplary materials for the substrate include, but are not limited to, cemented carbides, carbides, ceramics, cements, and polycrystalline cubic boron nitride (PcBN).

Exemplary cemented carbides include cobalt cemented tungsten carbides wherein the cobalt content is up to about 15 weight percent cobalt so as to also include a tungsten carbide substrate without any cobalt. In the case of a cemented (cobalt) tungsten carbide, the substrate may exhibit a zone of binder enrichment beginning at and extending inwardly from the surface of the substrate.

As another alternative, the cemented carbide substrate may not present binder enrichment. The cemented carbide substrate may also contain one or more additives such as, for example, one or more of the following elements and/or their compounds: titanium, niobium, vanadium, tantalum, chromium, zirconium and/or hafnium. The cemented carbide substrate may also contain nitrogen therein.

Exemplary ceramics include silicon nitride-based ceramics, SiAlON-based ceramics, titanium carbonitride-based ceramics, titanium diboride-based ceramics and alumina-based ceramics. Exemplary cermets include cermets that have nickel-cobalt binder and a high level of titanium and could further include tungsten carbide, and titanium carbide. The cermet may also contain nitrogen therein.

Exemplary PcBN materials include those with ceramic or metallic binders. The PcBN materials can be used in conjunction with cutting inserts in a number of basic ways. For one way, the PcBN inserts may be brazed to the cutting insert body. For another way, the PcBN cutting inserts may be full top cutting inserts. For still another way, the cutting insert may be a solid piece of PcBN.

Exemplary PcBN substrates include the following PcBN materials with the compositions as set forth.

PcBN Composition No. 1 has a composition equal to about 12 weight percent cobalt binder and about 88 weight percent cubic boron nitride. PcBN Composition No. 1 is typically used for grooving hard steels and cast irons, for moderate to heavy interrupted cutting in hard steels, and/or superalloy machining.

PcBN Composition No. 2 has a composition equal to about 50 weight percent titanium carbide binder and about 50 weight percent cubic boron nitride. PcBN Composition No. 2 is typically used for the finishing of hard steels.

PcBN Composition No. 3 has a composition equal to about 10 weight percent binder that comprises aluminum nitride and silicon carbide and titanium diboride wherein the aluminum nitride is the dominant component of the binder, and about 90 weight percent cubic boron nitride.

PcBN Composition No. 4 has a composition equal to about 18 weight percent aluminum nitride binder and about 82 weight percent cubic boron nitride. Cutting inserts using PcBN Compositions Nos. 3 and 4 are typically a solid piece of PcBN wherein such cutting inserts are typically used on hard and soft cast irons for moderate to heavy interrupted cutting.

Coated cutting insert 20 has a flank surface 24 and a rake surface 26. The flank surface 24 and the rake surface 26 intersect to form a cutting edge 28 at the intersection thereof. Coated cutting insert 20 contains an aperture 30 therein. The aperture 30 is useful for securing the cutting insert 20 to a tool holder.

Coated cutting insert 20 has a coating scheme illustrated by brackets 32 in FIG. 2. The specific coating scheme 32 comprises four coating layers. Each one of these coating layers is described below.

The base coating layer 34 is applied by chemical vapor deposition to the surface of the substrate 22. In some instances, the surface of the substrate may be treated prior to coating such as, for example, by impingement by a slurry that contains hard particles. One exemplary type of surface treatment is wet-blasting the surface with a slurry comprising water and alumina particles. In other instances the surface is not treated prior to coating.

In this coating scheme, the base coating layer 34 comprises titanium nitride; however, it should be appreciated that the composition of the base coating layer may depend upon the composition of the substrate material so as to achieve the best adhesion of the coating to the substrate. For example, in the case of the substrate that is PcBN or a ceramic, there may be applied a base layer of alumina. In this coating scheme of FIGS. 1 and 2, the gases used in this process step to deposit the titanium nitride base coating layer 34 are $H_2$, $N_2$ and $TiCl_4$. Base coating layer 34 may be applied at a temperature that ranges between about 850 degrees Centigrade and about 920 degrees Centigrade. As an alternate range, the base coating layer 34 may be applied at a temperature that ranges between about 890 degrees Centigrade and about 910 degrees Centigrade.

The pressure and the duration of the process to deposit the base coating layer 34 vary to achieve the desired coating thickness. In regard to the thickness of the base coating layer 34, as one alternative, the thickness of the base coating layer 34 ranges between greater than 0 micrometers and about 3 micrometers. As another alternative range, the thickness of the base coating layer 34 ranges between greater than 0 micrometers and about 1 micrometer. As still another alternative range, the thickness of the base coating layer 34 ranges between greater than 0 micrometers and about 0.5 micrometers. As can be appreciated, the specific thickness of the base coating layer 34 may vary depending upon the specific application for the cutting insert.

The intermediate coating layer 36 is applied by chemical vapor deposition on the base coating layer 34. The gases used in this process step are $H_2$, $N_2$, $CH_3CN$ and $TiCl_4$. The intermediate coating can be applied with other gaseous mixtures such as, for example, ethane and nitrogen, and methane and nitrogen, as well as other known mixtures. Intermediate coating layer 36 comprises titanium carbonitride. Intermediate coating layer 36 is applied at a temperature that ranges between about 800 degrees Centigrade and about 920 degrees Centigrade. As an alternate range, the intermediate coating layer 36 may be applied at a temperature that ranges between about 850 degrees Centigrade and about 920 degrees Centigrade. As still another alternate range, the intermediate coating layer 36 may be applied at a temperature that ranges between about 870 degrees Centigrade and about 910 degrees Centigrade.

The pressure and the duration of the process to deposit the intermediate coating layer 36 vary to achieve the desired coating thickness. In this regard, the thickness of the intermediate coating layer 36 may range between about 1 micrometers and about 25 micrometers. As an alternative range, the thickness of the intermediate coating may range between about 3 micrometers and about 15 micrometers. As another alternative range, the thickness of the intermediate coating may range between about 1 micrometers and about 5 micrometers. Still another alternate range for the thickness of the intermediate coating layer 36 is between about 5 micrometers and about 25 micrometers.

The modification coating layer 38 is applied by chemical vapor deposition on the intermediate coating layer 36. The gases that can be used in this process step are $H_2$, $N_2$ and $TiCl_4$, $AlCl_3$, HCl, CO, $CO_2$ and $CH_3CN$. Modification coating layer 38 can include titanium, aluminum, nitrogen, oxygen and carbon. When all of the above elements are present, applicants believe that the modification coating layer 38 comprises titanium aluminum oxycarbonitride (TiAlOCN). There are, however, some instances when the modification layer comprises multiple layers wherein these layers include titanium oxycarbonitride (TiOCN) and/or titanium oxynitride (TiON) along with titanium aluminum oxycarbonitride. Modification coating layer 38 is applied at a temperature that ranges between about 750 degrees Centigrade and about 920 degrees Centigrade. As an alternative temperature range, the modification coating layer 38 is applied at a temperature that ranges between about 850 degrees Centigrade and about 920 degrees Centigrade. As still another alternate temperature range, the modification coating layer 38 may be applied at a temperature that ranges between about 870 degrees Centigrade and about 890 degrees Centigrade.

The pressure and the duration of the process to deposit the modification coating layer 38 vary to achieve the desired coating thickness. In this regard, the thickness of the modification coating layer 38 is between about 0.5 micrometers and about 5 micrometers. As an alternative range, the thickness of the modification coating layer 38 may range between about 0.1 micrometers and about 1.5 micrometers.

The total combined thickness of the intermediate coating layer 36 and the modification layer 38 ranges between about 1 micrometers and about 30 micrometers. As an alternate range, the combined thickness of the intermediate coating layer 36 and the modification coating layer 38 ranges between about 1.5 micrometers and about 25 micrometers.

The outer coating layer 40 is applied by chemical vapor deposition to the modification coating layer 38. The gases present in this process step are $H_2$, $N_2$, $AlCl_3$, HCl, CO, $CO_2$ and $H_2S$. Outer coating layer 40 comprises alumina, and may comprise multiple layers of alumina. As will become apparent from the disclosure below, the crystalline phase of the alumina layer may comprise alpha alone, or kappa alone or a mixture of alpha and kappa phases. In the case of an alpha-alumina layer deposited per the invention, the surface of the alpha-alumina coating layer 40 exhibits a platelet grain morphology at the surface thereof. In the case of a kappa-alumina layer deposited per the invention, the surface of the kappa-alumina coating layer 40 exhibits either a lenticular grain morphology or a polyhedra-lenticular grain morphology at the surface thereof. In the case of an alpha-kappa-alumina layer deposited per the invention, the surface of the alpha-kappa-alumina coating layer 40 exhibits either a large multi-faceted grain morphology or a polyhedra-multifaceted grain morphology at the surface thereof.

The alumina coating layer 40 is applied at a temperature that ranges between about 750 degrees Centigrade and about 920 degrees Centigrade. Other alternative temperature ranges for the application of the alumina coating layer 40 comprise: between about 800 degrees Centigrade and about 920 degrees Centigrade; between about 850 degrees Centigrade and about 920 degrees Centigrade; and between about 865 degrees Centigrade and about 895 degrees Centigrade.

The pressure and the duration of the process to deposit the outer coating layer 40 vary to achieve the desired coating thickness. One range for the thickness of the alumina coating layer 40 is between about 1 micrometers and about 20 micrometers. An alternative range for the thickness of the alumina coating layer 40 is between about 2 micrometers and about 3 micrometers. Still another alternative range for the thickness of the alumina coating layer 40 is between about 4 micrometers and about 15 micrometers. Yet, another alternative range for the thickness of the alumina coating layer 40 is between about 6 micrometers and about 12 micrometers.

The total thickness of the overall coating scheme 32 ranges between about 3 micrometers and about 40 micrometers. As an alternate range, the overall thickness of the coating scheme 32 ranges between about 20 micrometers and about 35 micrometers. As an alternate range, the overall thickness of the coating scheme 32 ranges between about 8 micrometers and about 12 micrometers. As yet another alternate range, the overall thickness of the coating scheme ranges between about 5 micrometers and about 7 micrometers.

The Table 1-1 below sets forth the process steps for a specific embodiment of a moderate temperature chemical vapor deposition (MT-CVD) method to deposit a coating scheme on a substrate, i.e., Inventive Heat No. 1. Inventive Heat No. 1 is the MT-CVD process used to coat the cutting inserts (or substrates) of FIG. 4 hereof. Inventive Heat No. 1 is also the process used to coat the cutting inserts identified as the cutting inserts of the invention in Table 1-5 hereof.

TABLE 1-1

Process Parameters for Inventive Heat No. 1

| Step/Coating Layer | Step 1: Base Layer of Titanium Nitride [thickness > 0 micrometers] | Step 2: Intermediate Layer of Titanium Carbonitride [thickness > 0 micrometers] | Step 3: Modification Layer of TiAlOCN [thickness = about 4.0 micrometers] | Step 4: Outer Layer of Alpha Alumina [thickness = about 2.0 micrometers] |
|---|---|---|---|---|
| Temperature Range (° C.) | 900-905 | 880-900 | 880 for the entire step | 880 for the entire step |
| Pressure Range (mb) | 70-160 | 70-75 | 75-90 | 75 for the entire step |
| Total Time For the Step (minutes) | 35 minutes | 157 minutes | 41 minutes | 360 minutes |
| Gases Present During the Step | $H_2$, $N_2$ and $TiCl_4$ | $H_2$, $N_2$ and $TiCl_4$ and $CH_3CN$ | $H_2$, $N_2$, $TiCl_4$, $AlCl_3$, HCl, CO, $CO_2$ and $CH_3CN$ | $H_2$, $N_2$, $AlCl_3$, HCl, CO, $CO_2$, and $H_2S$ |

The specific coating layers are set out in the second through the fifth columns from the left side of Table 1-1. The left-hand column presents four process parameters for each coating layer. These process parameters are: the temperature range in degrees Centigrade (° C.), the pressure range in millibars (mb), the total time (or duration) in minutes to deposit the coating layer, and the gases present at one time or another during the deposition of the coating layer. The specific method set forth in Table 1-1, i.e., Inventive Heat No. 1, produced a coating scheme that had the following properties as set forth in Table 1-2.

TABLE 1-2

Selected Properties of the Coating Scheme of Inventive Heat No. 1

| Property | Value |
|---|---|
| Thickness of TiN Base Layer | 0.4 micrometers |
| Total Thickness of TiCN Intermediate Layer and TiAlOCN Modification Layer | 3.2 micrometers |
| Thickness of Outer Alumina Layer | 2.3 micrometers |
| Hardness Vickers Hardness with a 25 gram load - Test 1 | 2398 ± 168 VHN |
| Hardness Vickers Hardness with a 25 gram load - Test 2 | 2365 ± 66 VHN |

Figure 6:
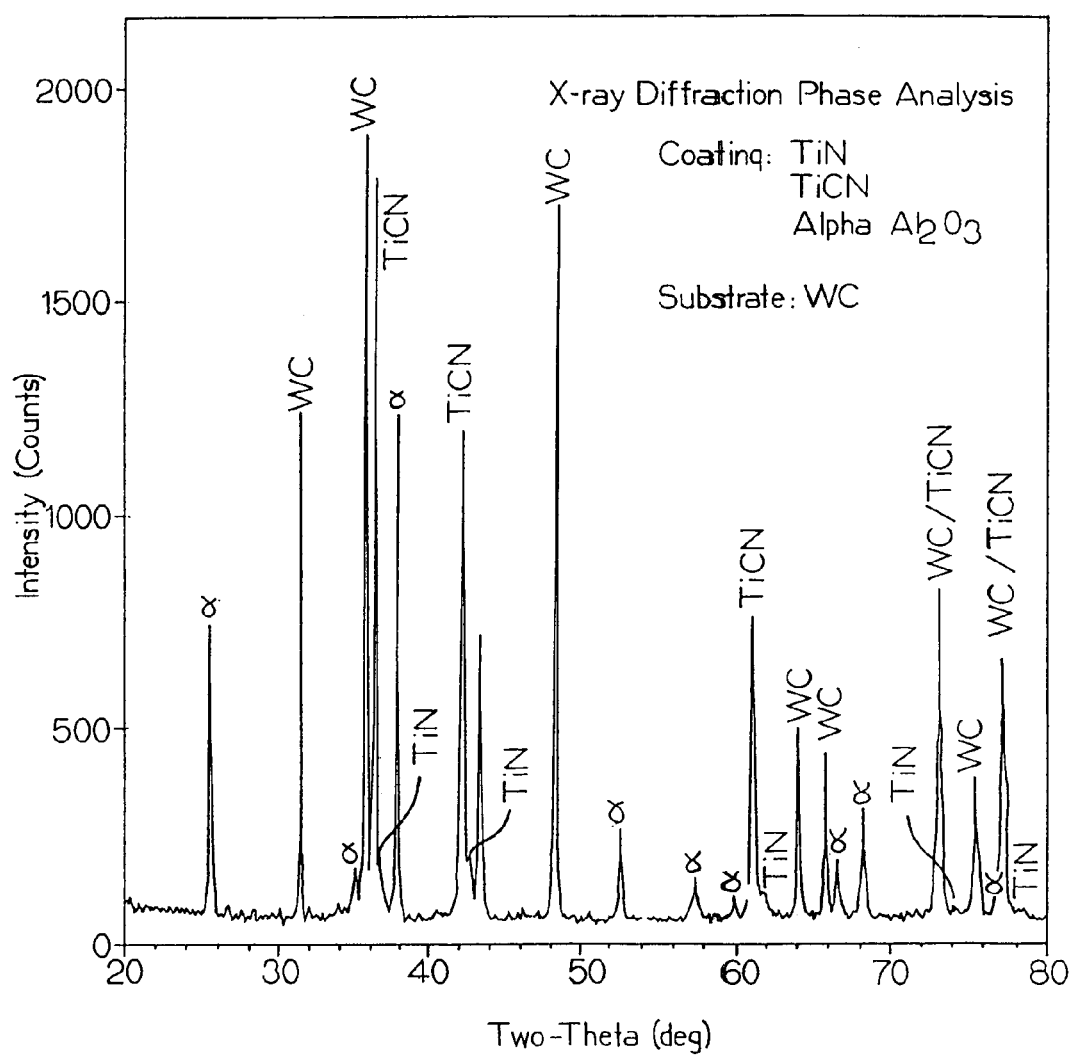
FIG. 6 is an x-ray diffraction pattern for the alumina coating layer of the cemented (cobalt) tungsten carbide substrate coated per the Inventive Heat No. 1 wherein the presence of alpha phase alumina, as well as titanium nitride, titanium carbonitride and tungsten carbide, are noted by their corresponding peaks.

FIG. 6 is an x-ray diffraction pattern of a coated cemented (cobalt) tungsten carbide substrate coated per the parameters of Inventive Heat No. 1. FIG. 6 shows that the outer coating layer is an alpha-alumina coating layer. As shown by the SEM photomicrograph FIG. 4, the surface of the alpha-alumina coating layer, i.e., the surface of the coated cutting insert or coated substrate, appears to exhibit a platelet grain morphology.

The coated cutting inserts coated per Inventive Heat No. 1 were compared against prior art coated cutting inserts coated according to a standard chemical vapor deposition procedure. The standard chemical vapor deposition coating procedure comprised the steps of applying a base layer of titanium nitride to the cemented (cobalt) tungsten carbide substrate applying an intermediate coating scheme that included layers of titanium carbonitride to the base layer, applying a blended coating layer that included titanium, aluminum, carbon, nitrogen and oxygen to the intermediate coating scheme, and applying an alumina layer to the blended coating layer. A part of the intermediate coating layer and all of the blended layer and all of the alpha-alumina coating layer were applied by chemical vapor deposition at a temperature of about 1000 degrees Centigrade. Table 1-3 below presents selected properties of the coating scheme produced by the above-described prior art process.

TABLE 1-3

Selected Properties of the Prior Art Coating Scheme

| Property | Value |
| --- | --- |
| Thickness of TiN Base Layer | 0.5 micrometers |
| Thickness of TiCN (890° C.) and TiCN (1000° C.) and Blended Layers (1000° C.) | 3.6 micrometers |
| Thickness of Alumina Layer | 2.3 micrometers |
| Hardness Vickers Hardness with a 25 gram load - Test 1 | 2431 ± 240 VHN |
| Hardness Vickers Hardness with a 25 gram load - Test 2 | 2400 ± 147 VHN |

Figure 5:
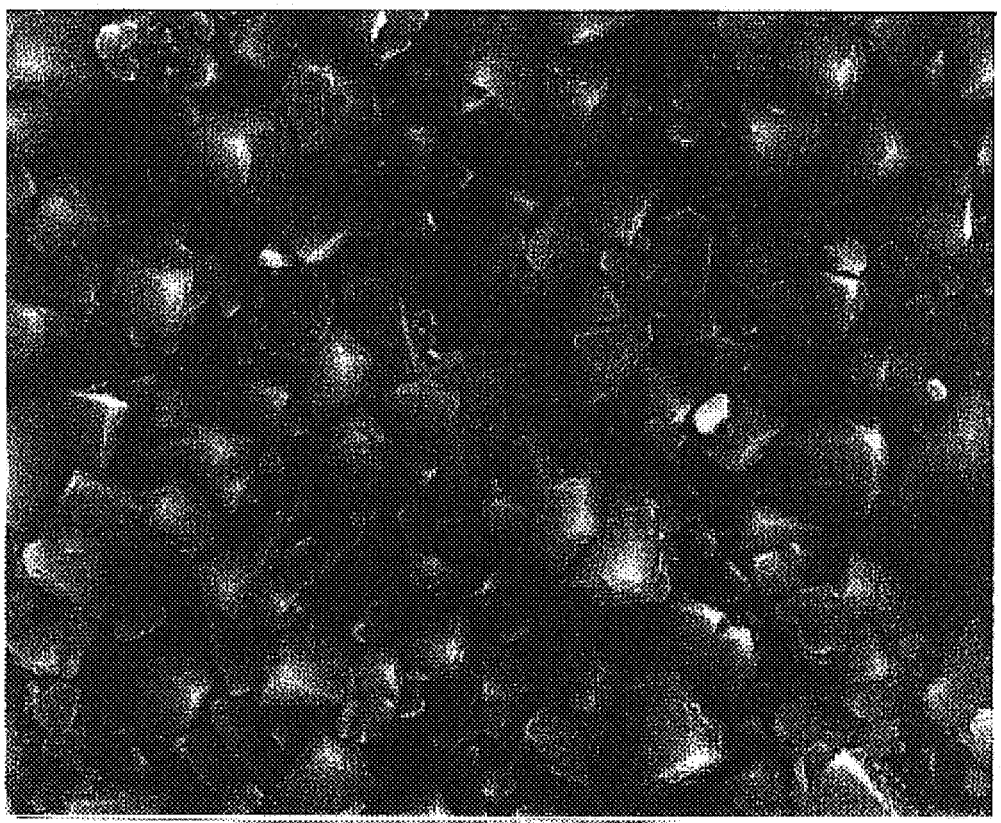
FIG. 5 is a photomicrograph taken by scanning electron microscopy (SEM) at a magnification of 15,000× of the surface of the high temperature alumina (outer) coating layer of a prior art coated cutting insert, and the photomicrograph has a 4 micrometer scale thereon.

The surface of the alumina coating layer of the prior art cutting insert has a blocky appearance as shown by the SEM photomicrograph FIG. 5.

Cutting tests were conducted that compared the inventive coated cutting inserts coated according to the process of Inventive Heat No. 1 and prior art coated cutting inserts coated according to prior art process described above were carried out. The substrate for both the inventive cutting inserts and the prior art cutting inserts comprised tungsten carbide (balance)-6 weight percent cobalt-0.4 weight percent chromium. The parameters of the test were as follows: Insert Style: SPHX1205PCERGPB; Cutter: 100B08RP90SP12C2WUFP; Lead Angle: 0 deg; Workpiece: Gray cast iron, class 40, block with holes; Operation: Flycut face milling; Speed: 1200 surface feet per minute (393.4 surface meters per minute); Feed: 0.01 inches per tooth (ipt) (0.254 millimeters per tooth); Depth of cut: Radial equals 3 inches (7.62 centimeters), and axial equals 0.08 inches (2.03 millimeters); Coolant: dry; Length/pass: 24 inches (61 centimeters). The failure criteria were as follows: flank wear equal to 0.012 inches (0.305 millimeters); maximum wear and nose wear equal to 0.016 inches (0.406 millimeters); depth of cut notch (DOCN) equal to 0.02 inches (0.508 millimeters); crater wear equal to 0.004 inches (0.102 millimeters). For these tests the failure mode was maximum flank wear and nose wear. The test results are set out in Tables 1-4 and 1-5 below.

Referring to Tables 1-4 and 1-5, the first column sets forth the condition of the substrate prior to application of the coating scheme. The term "as ground" means that the surface of the substrate was not treated prior to application of the coating. The term "alumina slurry blasted" means that the surface of the substrate was subjected to a blasting by a slurry of alumina particles and water. The second column sets forth the edge preparation for the cutting insert wherein the cutting edge either was honed only or had a T-land and was honed. The third through fifth columns set forth the number of passes until failure (the failure mode was maximum flank wear and nose wear) for each one of three separate tests. The sixth column sets forth the average number of passes until failure. In Table 1-5, the seventh column sets forth the percentage of improvement of the cutting insert coated per Inventive Heat No. 1 as compared to the performance of the prior art cutting insert described above.

TABLE 1-4

Tool Life Test Results for Prior Art Cutting Insert
(Number of Passes until Failure)

| Pre-Coat Substrate Surface Condition | Edge Preparation | Rep. 1 | Rep. 2 | Rep. 3 | Average No. of Passes |
| --- | --- | --- | --- | --- | --- |
| As Ground | Hone | 7 | 8 | 6 | 7 |
| As Ground | T-Land & Hone | 10 | 8 | 6 | 8 |
| Alumina Slurry Blasted | Hone | 10 | 7 | 6 | 7.7 |
| Alumina Slurry Blasted | T-Land & Hone | 8 | 6 | 6 | 6.7 |

TABLE 1-5

Tool Life Test Results for Inventive Cutting Insert Coated per
Inventive Heat No. 1
(Number of Passes until Failure)

| Pre-Coat Substrate Surface Condition | Edge Preparation | Rep. 1 | Rep. 2 | Rep. 3 | Average No. of Passes | Percent Improvement Over Prior Art Cutting Insert Results in Table 1-4 |
| --- | --- | --- | --- | --- | --- | --- |
| As Ground | Hone | 8 | 8 | 7 | 7.7 | 10% |
| As Ground | T-Land & Hone | 11 | 7 | 10 | 9.3 | 16% |
| Alumina Slurry Blasted | Hone | 10 | 8 | 10 | 9.3 | 21% |
| Alumina Slurry Blasted | T-Land & Hone | 12 | 8 | 11 | 10.3 | 54% |

Referring to Tables 1-4 and 1-5, it is self-evident that the cutting insert of the invention provides for much improved performance results as compared to a prior art cutting insert. This is especially the case for those inventive coated cutting inserts that had the substrate blasted with the alumina-water slurry prior to application of the coating and had an edge preparation comprising the T-land and the hone.

Figure 4:
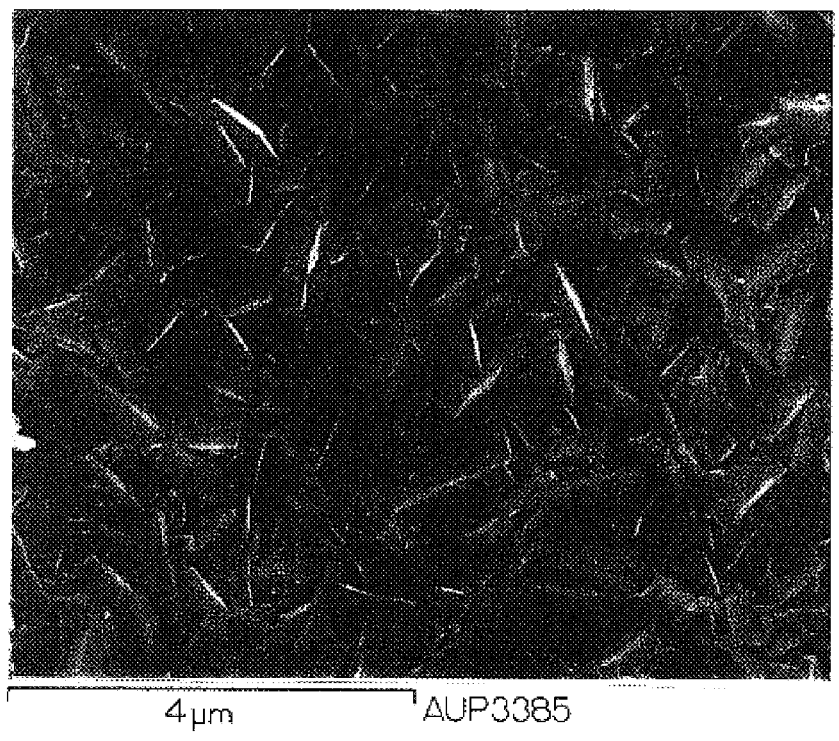
FIG. 4 is a photomicrograph taken by scanning electron microscopy (SEM) at a magnification of 15,000× of the surface of the alumina (outer) coating layer of a specific embodiment of a coated cutting insert coated per the process of Inventive Heat No. 1 wherein the alumina coating layer has a platelet grain morphology, and the photomicrograph has a 4 micrometer scale thereon.

FIG. 4 is a photomicrograph taken by scanning electron microscopy (SEM) that shows the surface of the coated cutting insert coated per the process of Inventive Heat No. 1. FIG. 4 shows that the alpha-alumina coating produced by the process of Inventive Heat No. 1 has a platelet grain morphology at the surface. Visual observation of the alpha alumina coating layer deposited by Inventive Heat No. 1 shows that it is shiny in appearance.

FIG. 5 is a SEM photomicrograph that shows the surface of the prior art coated cutting insert coated by the high temperature prior art process described herein above. FIG. 5 shows that the prior art alumina coating is blocky at the surface. Visual observation of the high temperature alpha coating layer deposited by the prior art process described above shows that it is dull in appearance.

As can be seen from the x-ray diffraction results and the photomicrographs, it is apparent that the Inventive Heat No. 1, which includes the moderate temperature application via chemical vapor deposition of the alumina layer at about 880° C., resulted in an alpha-alumina layer that had a platelet grain morphology at the surface thereof.

Set forth below in Table 1 are the process parameters for Inventive Heat No. 2, as well as a description of the material that comprises the coating layers. Referring to Table 1, the column identified as "Material" presents the material of the coating layer, the column identified as "Temperature Range" presents the temperature range (or temperature) in degrees Centigrade (° C.) for the process step to deposit the corresponding coating layer, the column identified as "Pressure Range" presents the pressure range (or pressure) in millibars (mb) for the process step to deposit the corresponding coating layer, and the column identified as "Total Time" presents the total duration in minutes for the process step to deposit the corresponding coating layer, and the column identified as "Gases Present" identifies the gases that were present at one time or another for the process step to deposit the corresponding coating layer.

Figure 7:
FIG. 7 is a photomicrograph (a magnification equal to 10,000×) of the surface of a coated cemented (carbide) tungsten carbide substrate coated per Inventive Heat No. 2 wherein there is a mixture of alpha phase alumina and kappa phase alumina with the alpha phase alumina being the dominant phase, and the photomicrograph shows that the alpha-kappa alumina coating layer has large multifaceted alumina grains so as to present a large multifaceted grain morphology at the surface.

FIG. 7 is a photomicrograph (magnification equal to 10,000×) of the surface of a cemented (cobalt) tungsten carbide substrate that was coated per Inventive Heat No. 2. FIG. 7 illustrates that the alumina coating layer comprises both the alpha crystalline phase of alumina and the kappa crystalline phase of alumina wherein this alpha-kappa alumina coating layer has a mixture of polyherda grains and multifaceted grains so as to present a polyhedra-multifaceted grain morphology at the surface thereof.

Figure 8:
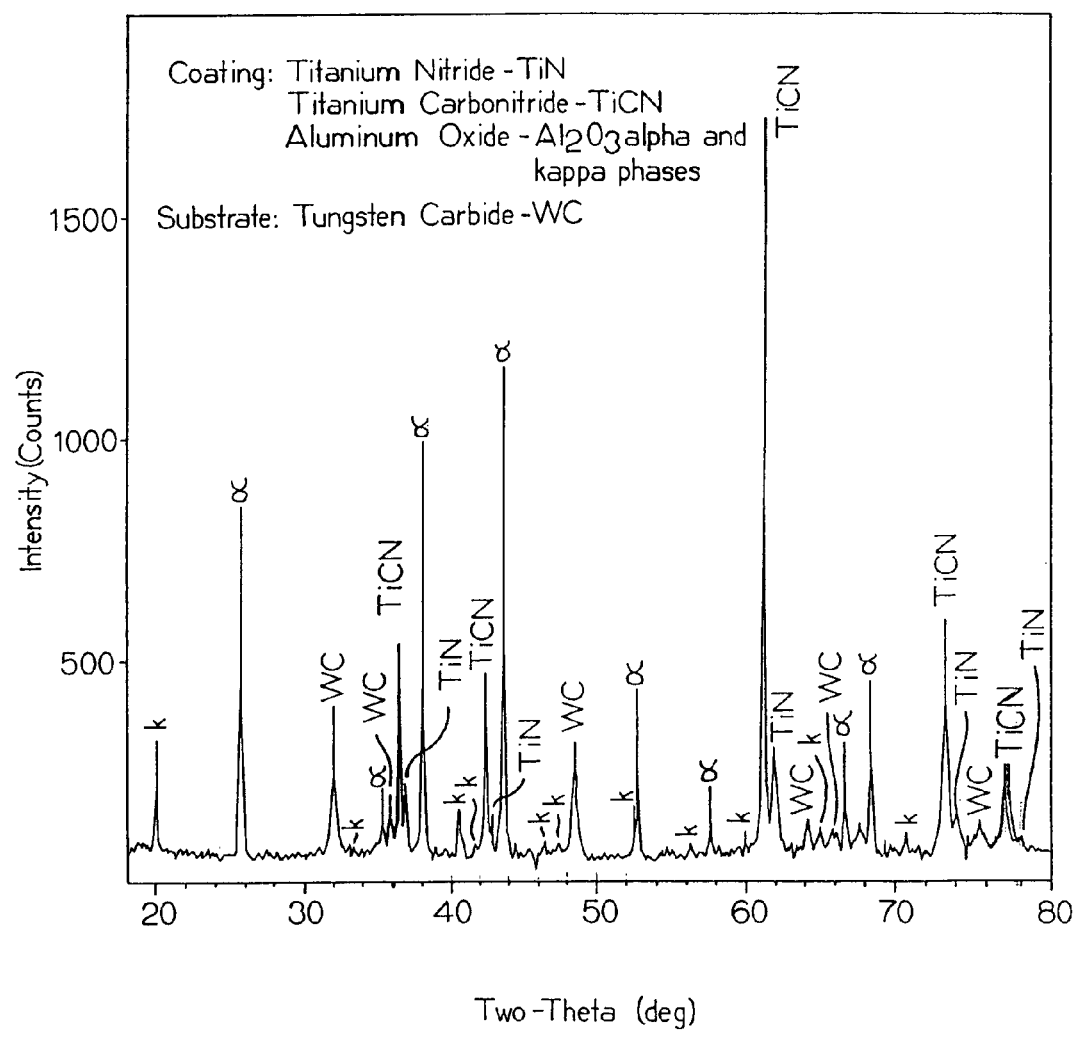
FIG. 8 is an x-ray diffraction pattern for a cemented (cobalt) tungsten carbide substrate coated per Inventive Heat No. 2 wherein the x-ray diffraction pattern was taken in the vicinity of the location of the photomicrograph of FIG. 7, and the x-ray diffraction pattern discloses that the alumina coating layer comprises a mixture of the alpha crystalline phase and the kappa crystalline phase alumina as shown by the corresponding peaks of these phases, and furthermore, the presence of tungsten carbide, titanium nitride and titanium carbonitride is noted by the presence of their corresponding peaks.

FIG. 8 is an X-ray diffraction (XRD) pattern of the alumina coating layer for a cemented (cobalt) tungsten carbide substrate coated per Inventive Heat No. 2. In FIG. 8, the existence of the alpha crystalline phase of alumina and the kappa crystalline phase of alumina is shown by their corresponding peaks. Furthermore, FIG. 8 shows the presence of titanium nitride, titanium carbonitride and tungsten carbide by their corresponding peaks.

Overall, it is apparent from FIGS. 7 and 8, that the MT-CVD alumina coating layer applied by Inventive Heat No. 2, especially when the deposition rate is high at a temperature equal to 870-890° C., resulted in an alpha-kappa alumina layer that has a polyhedra-multifaceted grain morphology at the surface thereof.

Set forth below in Table 2 are the process parameters for Inventive Heat No. 3, as well as a description of the material that comprises the coating layers. Referring to Table 2, the column identified as "Material" presents the material of the coating layer, the column identified as "Temperature Range" presents the temperature range (or temperature) in degrees Centigrade (° C.) for the process step to deposit the corresponding coating layer, the column identified as "Pressure Range" presents the pressure range (or pressure) in millibars (mb) for the process step to deposit the corresponding coating layer, and the column identified as "Total Time" presents the total duration in minutes for the process step to deposit the corresponding coating layer, and the column identified as "Gases Present" identifies the gases that were present for the process step to deposit the corresponding coating layer.

TABLE 1

Process Steps for Inventive Heat No. 2

| Material | Temperature Range (° C.) | Pressure Range (mb) | Total Time (Minutes) | Gases Present |
|---|---|---|---|---|
| α-alumina & κ-alumina | 870-890 | 79 | 180 | $H_2 + AlCl_3 + HCl + CO_2 + H_2S$ [High Deposition Rate] |
| α-alumina & κ-alumina | 870-890 | 79 | 30 | $H_2 + N_2 + AlCl_3 + HCl + CO + CO_2$ |
| Modification Layer | * | * | * | * |
| TiOCN | 870-890 | 79 | 15 | $H_2 + N_2 + TiCl_4 + HCl + CO + CH_4$ (lower $TiCL_4$ content) |
| TiAlOCN | 870-890 | 100 | 15 | $H_2 + N_2 + TiCl_4 + AlCl_3 + HCl + CO + CH_4$ |
| TiOCN | 870-890 | 500 | 20 | $H_2 + N_2 + TiCl_4 + HCl + CO + CH_4$ |
| Modification Layer | * | * | * | * |
| TiCN | 870-890 | 500 | 60 | $H_2$ & $N_2$ & $CH_4$ & $TiCl_4$ |
| TiCN | 870-890 | 100 | 160 | $H_2$ & $N_2$ & $CH_3CN$ & $TiCl_4$ |
| TiN | 870-890 | 158 | 35 | $H_2$ & $N_2$ & $TiCl_4$ |
| SUBSTRATE | | | | |

TABLE 2

Process Steps for Inventive Heat No. 3

| Material | Temperature Range (° C.) | Pressure Range (mb) | Total Time (Minutes) | Gases Present |
|---|---|---|---|---|
| K-alumina | 870-890 | 79 | 240 | $H_2 + AlCl_3 + HCl + CO_2 + H_2S$ |
| K-alumina | 870-890 | 79 | 30 | $H_2 + N_2 + AlCl_3 + HCl + CO + CO_2$ |
| Modification Layer | * | * | * | * |
| TiAlOCN | 870-890 | 79 | 15 | $H_2 + N_2 + TiCl_4 + AlCl_3 + HCl + CO + CH_4$ (lower $TiCL_4$ content) |
| TiAlOCN | 870-890 | 100 | 15 | $H_2 + N_2 + TiCl_4 + AlCl_3 + HCl + CO + CH_4$ |
| TiOCN | 870-890 | 500 | 20 | $H_2 + N_2 + TiCl_4 + HCl + CO + CH_4$ |
| Modification Layer | * | * | * | * |
| TiCN | 870-890 | 500 | 60 | $H_2$ & $N_2$ & $CH_4$ & $TiCl_4$ |
| TiCN | 870-890 | 100 | 130 | $H_2$ & $N_2$ & $CH_3CN$ & $TiCl_4$ |
| TiN | 870-890 | 158 | 50 | $H_2$ & $N_2$ & $TiCl_4$ |
| alumina | 870-890 | | | $H_2 + N_2 + AlCl_3 + HCl + CO + CO_2 + H_2S$ |
| SUBSTRATE (ceramic and solid high content PcBN) | | | | |

Table 2 shows that Inventive Heat No. 3 was used to coat a PcBN substrate.

Although not presented in a tabular format, Inventive Heat No. 5 is essentially the same as Inventive Heat No. 3, except that Inventive Heat No. 5 was used to coat a high temperature braze PcBN substrate and Inventive Heat No. 5 did not include the deposition of a MT-alumina base coating layer like Inventive Heat No. 3. It should be appreciated that a coating scheme applied per the steps of Inventive Heat No. 5 can also be applied to a cemented (cobalt) tungsten carbide substrate.

Figure 9:
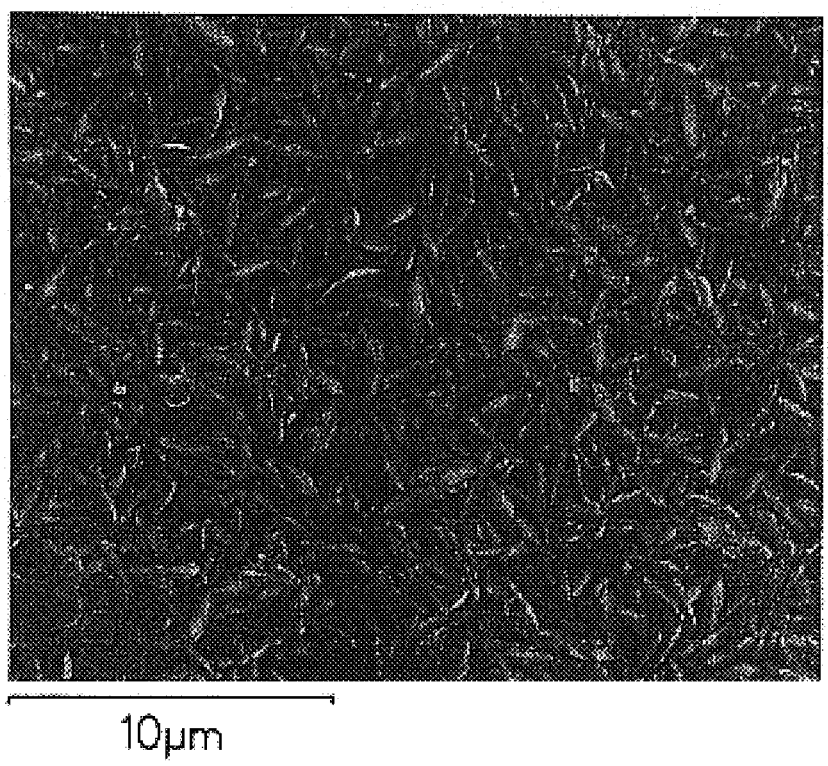
FIG. 9 is a photomicrograph (a magnification equal to 5000×) of the surface of the alumina coating layer applied to a cemented (cobalt) tungsten carbide substrate per the Inventive Heat No. 5 wherein the alumina coating layer is kappa-alumina and the photomicrograph shows that the kappa alumina coating layer has a polyhedra-lenticular grain morphology at the surface thereof.
Figure 12:
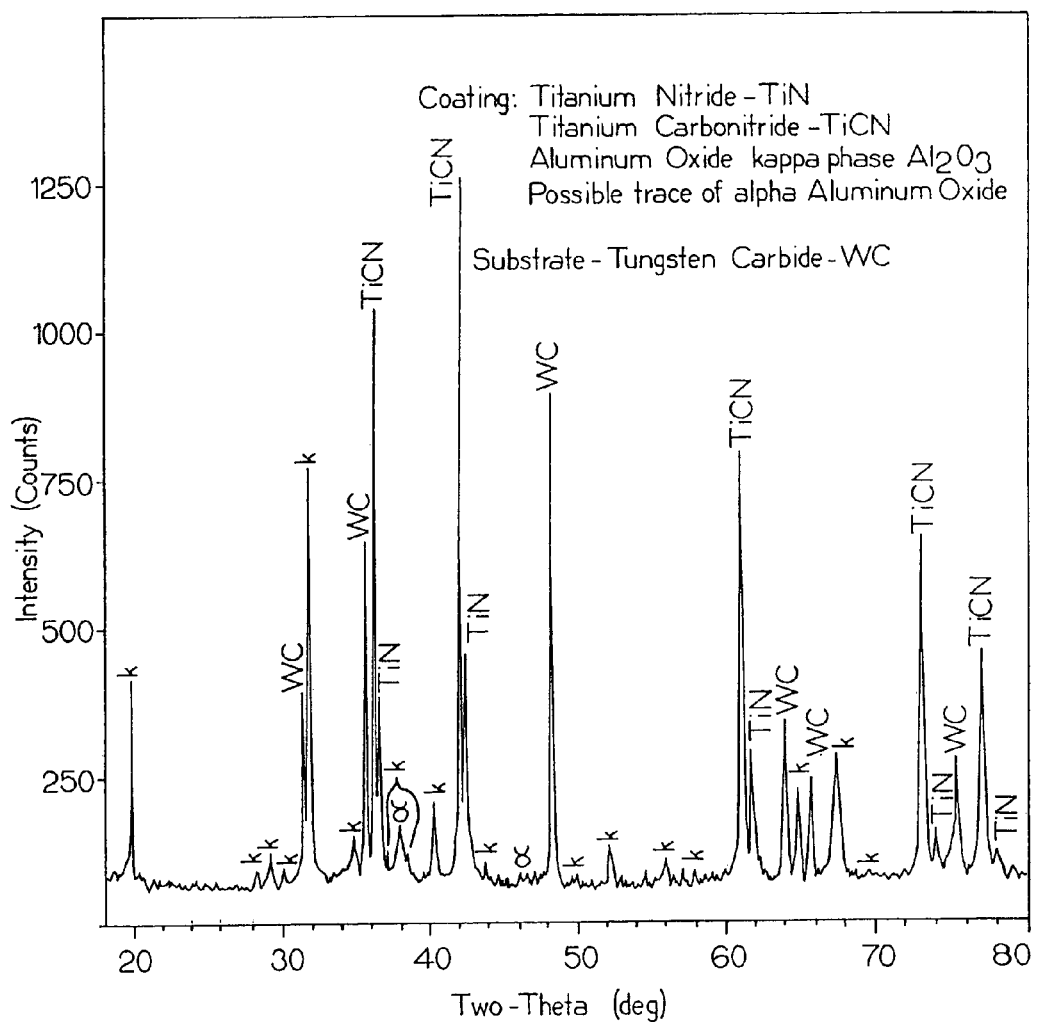
FIG. 12 is an x-ray diffraction pattern of a coated cemented (cobalt) tungsten carbide substrate coated per Inventive Heat No. 5 wherein the alumina coating layer is kappa crystalline phase as noted by its corresponding peak (along with a trace of alpha phase alumina as noted by its corresponding peak) and wherein the presence of tungsten carbide, titanium nitride and titanium carbonitride are also noted by their corresponding peaks.

FIG. 9 is a photomicrograph (a magnification equal to 5000×) of the surface of the alumina coating layer applied to a cemented (cobalt) tungsten carbide substrate per the Inventive Heat No. 5. FIG. 9 shows that the surface of the kappa alumina layer has a lenticular grain morphology. FIG. 12 is an X-ray diffraction (XRD) pattern for a cemented (cobalt) tungsten carbide substrate coated per Inventive Heat No. 5. In FIG. 12, the existence of the kappa crystalline phase of alumina is shown by its corresponding peak. FIG. 12 also shows the presence of titanium nitride, titanium carbonitride and tungsten carbide by their corresponding peaks.

Overall, it is apparent from the x-ray diffraction results of FIG. 12 and the photomicrographs of FIG. 9 that the alumina coating layer of the coating scheme applied by either Inventive Heat No. 5, or Inventive Heat No. 3 for that matter, that included the MT-CVD application of an alumina layer at a temperature range of 870-890° C. resulted in a kappa-alumina coating layer that has a polyhedra-lenticular grain morphology at the surface thereof.

Set forth in Table 3 are the process parameters for Inventive Heat No. 4, as well as a description of the material that comprises the coating layers. Referring to Table 3, the column identified as "Material" presents the material of the coating layer, the column identified as "Temperature Range" presents the temperature range (or temperature) in degrees Centigrade (° C.) for the process step to deposit the corresponding coating layer, the column identified as "Pressure Range" presents the pressure range (or pressure) in millibars (mb) for the process step to deposit the corresponding coating layer, and the column identified as "Total Time" presents the total duration in minutes for the process step to deposit the corresponding coating layer, and the column identified as "Gases Present" identifies the gases that were present for the process step to deposit the corresponding coating layer.

TABLE 3

Process Steps for Inventive Heat No. 4

| Material | Temperature Range(° C.) | Pressure Range (mb) | Total Time (Minutes) | Gases Present |
|---|---|---|---|---|
| Alumina | 870-890 | 79 | 240 | $H_2 + AlCl_3 + HCl + CO_2 + H_2S$ [Higher Rate Deposition] |
| Alumina | 870-890 | 79 | 30 | $H_2 + N_2 + AlCl_3 + HCl + CO + CO_2$ |
| Modification Layer | * | * | * | * |
| TiOCN | 870-890 | 79 | 15 | $H_2 + N_2 + TiCl_4 + HCl + CO + CH_4$ (lower $TiCl_4$ content) |
| TiAlOCN | 870-890 | 100 | 15 | $H_2 + N_2 + TiCl_4 + AlCl_3 + HCl + CO + CH_4$ |
| TiOCN | 870-890 | 500 | 20 | $H_2 + N_2 + TiCl_4 + HCl + CO + CH_4$ |
| Modification Layer | * | * | * | * |
| TiCN | 870-890 | 500 | 60 | $H_2 + N_2 + CH_4 + TiCl_4$ |
| TiCN | 870-890 | 100 | 130 | $H_2$ & $N_2$ & $CH_3CN$ & $TiCl_4$ |
| TiN | 870-890 | 158 | 50 | $H_2$ & $N_2$ & $TiCl_4$ |
| SUBSTRATE PcBN Tipped Cutting Inserts | | | | |

The substrate coated by Inventive Heat No. 4 was a polycrystalline cubic boron nitride tipped cutting insert wherein the PcBN tip had a composition comprising about 12 weight percent cobalt and about 88 weight percent cBN. The process disclosed as Inventive Heat No. 4 was also used to coat tungsten carbide substrates.

Figure 10:
FIG. 10 is a photomicrograph (a magnification equal to 10,000×) of the surface of the alumina coating layer of a tungsten carbide substrate coated per Inventive Heat No. 4 wherein the alumina coating layer comprises a mixture of alpha phase alumina and kappa phase alumina, and the photomicrograph shows that the alpha-kappa alumina coating layer has a mixture of polyhedra alumina grains and multifaceted alumina grains so as to present a polyhedra-multifacted grain morphology at the surface thereof.
Figure 11:
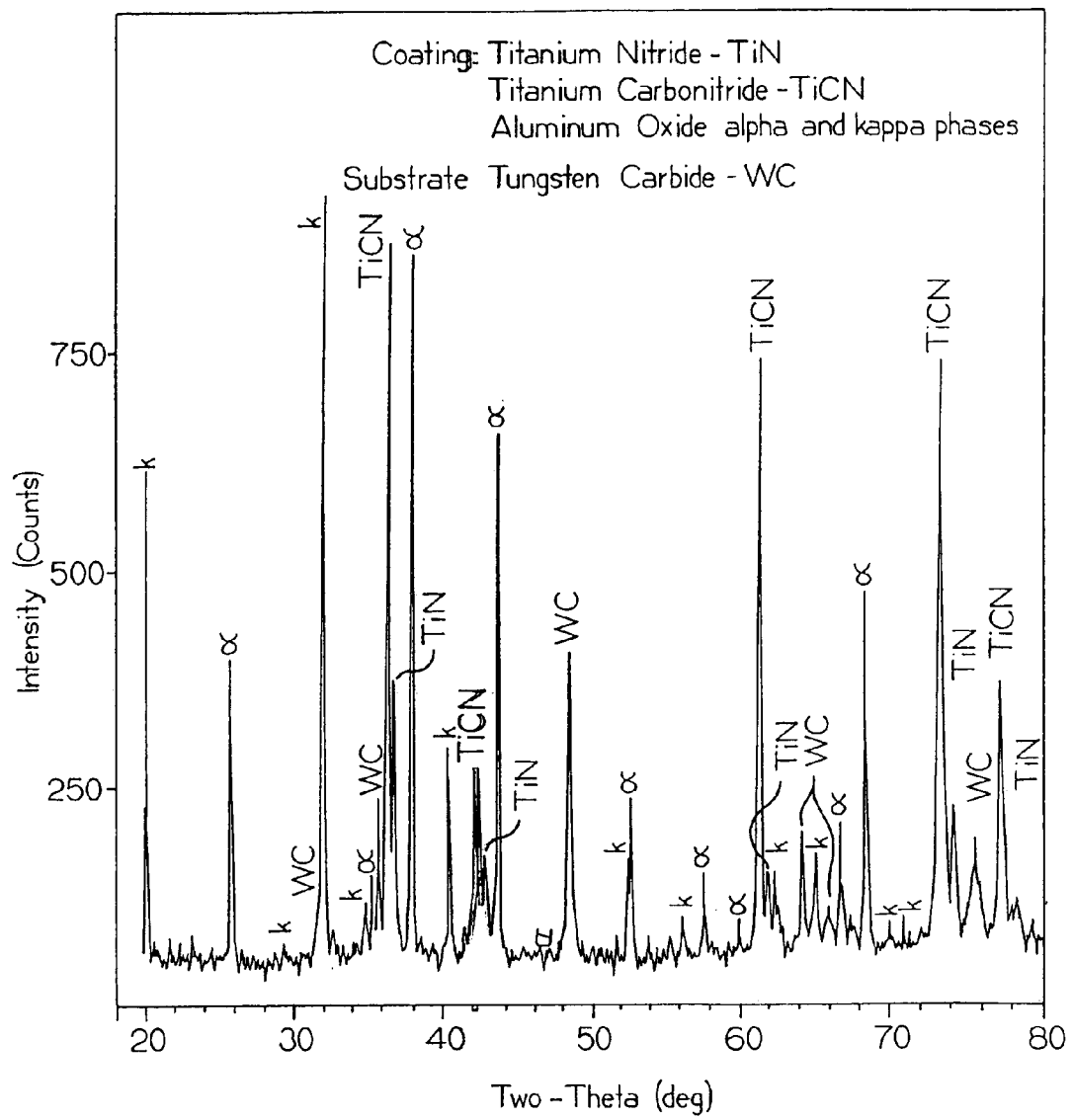
FIG. 11 is an x-ray diffraction pattern for a coated cemented (cobalt) tungsten carbide substrate coated per Inventive Heat No. 4 and wherein the presence of kappa-alpha alumina, tungsten carbide, titanium nitride and titanium carbonitride are noted by their corresponding peaks.

FIG. 10 is a photomicrograph (a magnification equal to 10,000×) of the surface of one of the cemented (cobalt) tungsten carbide substrates coated per Inventive Heat No. 4. FIG. 10 shows the presence of a mixture of alpha phase alumina and kappa phase alumina. The photomicrograph shows that the alpha-kappa alumina coating layer has a large multifaceted grain morphology at the surface thereof.

Figure 13:
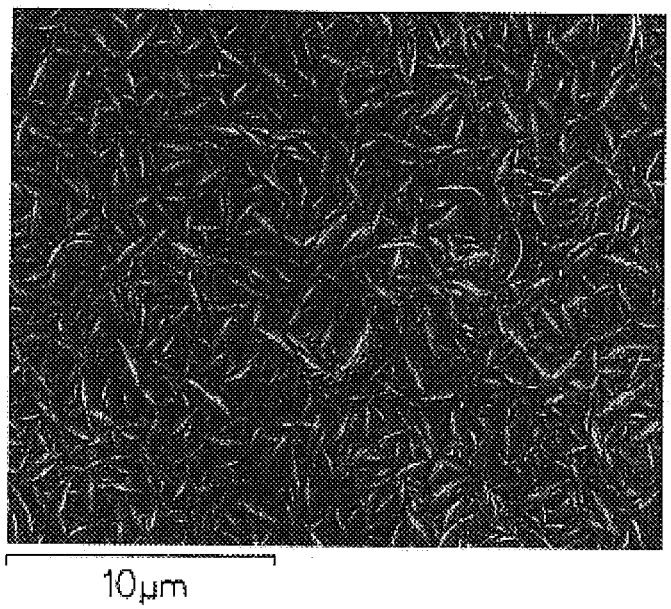
FIG. 13 is a photomicrograph (at a magnification equal to 5000×) of the surface of the kappa-alumina coating deposited on a cemented (cobalt) tungsten carbide per Inventive Heat No. 8, and wherein the photomicrograph shows that the kappa-alumina coating has a lenticular grain morphology at the surface.

FIG. 13 shows the x-ray diffraction pattern of a coated substrate that was coated per the process of Inventive Heat No. 8. The crystalline phase of the alumina coating for this substrate was kappa phase as shown by its corresponding peaks.

Set forth below in Table 5 are the process parameters for Inventive Heat No. 6, as well as a description of the material that comprises the coating layers. Referring to Table 5, the column identified as "Material" presents the material of the coating layer, the column identified as "Temperature Range" presents the temperature range (or temperature) in degrees Centigrade (° C.) for the process step to deposit the corresponding coating layer, the column identified as "Pressure Range" presents the pressure range (or pressure) in millibars (mb) for the process step to deposit the corresponding coating layer, and the column identified as "Total Time" presents the total duration in minutes for the process step to deposit the corresponding coating layer, and the column identified as "Gases Present" identifies the gases that were present for the process step to deposit the corresponding coating layer. X-ray diffraction (XRD) patterns of the alumina coating of Inventive Heat No. 6 showed the existence of the alpha crystalline phase of alumina.

TABLE 5

Process Steps for Inventive Heat No. 6

| Material | Temperature Range (° C.) | Pressure Range (mb) | Total Time (Minutes) | Gases Present |
|---|---|---|---|---|
| α-alumina | 880 | 75 | 330 | $H_2 + N_2 + AlCl_3 + HCl + CO + CO_2 + H_2S$ |
| Alumina and nitrogen | 880 | 75 | 30 | $H_2 + N_2 + AlCl_3 + HCl + CO + CO_2 + H_2S$ |
| Modification Layer | *** | *** | *** | *** |
| TiON | 880 | 75 | 6 | $H_2 + N_2 + TiCl_4 + HCl + CO + CO_2 + CH_3CN$ |
| TiAlOCN | 880 | 75 | 5 | $H_2 + N_2 + TiCl_4 + AlCl_3 + HCl + CO + CO_2 + CH_3CN$ |
| TiOCN | 880 | 90 | 30 | $H_2 + N_2 + TiCl_4 + CO + CO_2 + CH_3CN$ |
| Modification Layer | *** | *** | *** | *** |
| TiCN | 880-900 | 70-90 | 157 | $H_2$ & $N_2$ & $CH_3CN$ & $TiCl_4$ |
| TiN | 900-905 | 70-160 | 35 | $H_2$ & $N_2$ & $TiCl_4$ |
| SUBSTRATE | | | | |

Set forth below in Table 6 are the process parameters for Inventive Heat No. 7, as well as a description of the material that comprises the coating layers. Referring to Table 6, the column identified as "Material" presents the material of the coating layer, the column identified as "Temperature Range" presents the temperature range (or temperature) in degrees Centigrade (° C.) for the process step to deposit the corresponding coating layer, the column identified as "Pressure Range" presents the pressure range (or pressure) in millibars (mb) for the process step to deposit the corresponding coating layer, and the column identified as "Total Time" presents the total duration in minutes for the process step to deposit the corresponding coating layer, and the column identified as "Gases Present" identifies the gases that were present for the process step to deposit the corresponding coating layer. It is expected that the alumina layer was alpha alumina. It should be appreciated that several coating layers were deposited on top of the alpha-alumina layer.

TABLE 6

Process Steps for Inventive Heat No. 7

| Material | Temperature Range (° C.) | Pressure Range (mb) | Total Time (Minutes) | Gases Present |
|---|---|---|---|---|
| TiN | 880 | 200 | 111 | $H_2$ & $N_2$ & $TiCl_4$ |
| TiCN | 880 | 200-500 | 66 | $H_2$ & $N_2$ & $CH_3CN$ & $TiCl_4$ |
| Adhesion Layer | 880 | 80-500 | 30 | $H_2 + CH_4 + N_2 + TiCl_4 + AlCl_3$ |
| α-alumina | 880 | 75 | 960 | $H_2 + N_2 + AlCl_3 + HCl + CO + CO_2 + H_2S$ |
| Alumina + nitrogen | 880 | 75 | 30 | $H_2 + N_2 + AlCl_3 + HCl + CO + CO_2 + CH_3CN$ |

TABLE 6-continued

Process Steps for Inventive Heat No. 7

| Material | Temperature Range (° C.) | Pressure Range (mb) | Total Time (Minutes) | Gases Present |
|---|---|---|---|---|
| Modification Layer | *** | *** | *** | *** |
| TiON | 880 | 75 | 6 | $H_2 + N_2 + TiCl_4 + HCl + CO + CO_2 + CH_3CN$ |
| TiAlOCN | 880 | 75 | 15 | $H_2 + N_2 + TiCl_4 + AlCl_3 + HCl + CO + CO_2 + CH_3CN$ |
| TiOCN | 880 | 90 | 90 | $H_2 + N_2 + TiCl_4 + CO + CO_2 + CH_3CN$ |
| Modification Layer | * | * | * | * |
| TiCN | 880-900 | 70-90 | 569 | $H_2$ & $N_2$ & $CH_3CN$ & $TiCl_4$ |
| TiN | 900-905 | 70-160 | 35 | $H_2$ & $N_2$ & $TiCl_4$ |
| SUBSTRATE | | | | |

Figure 3:
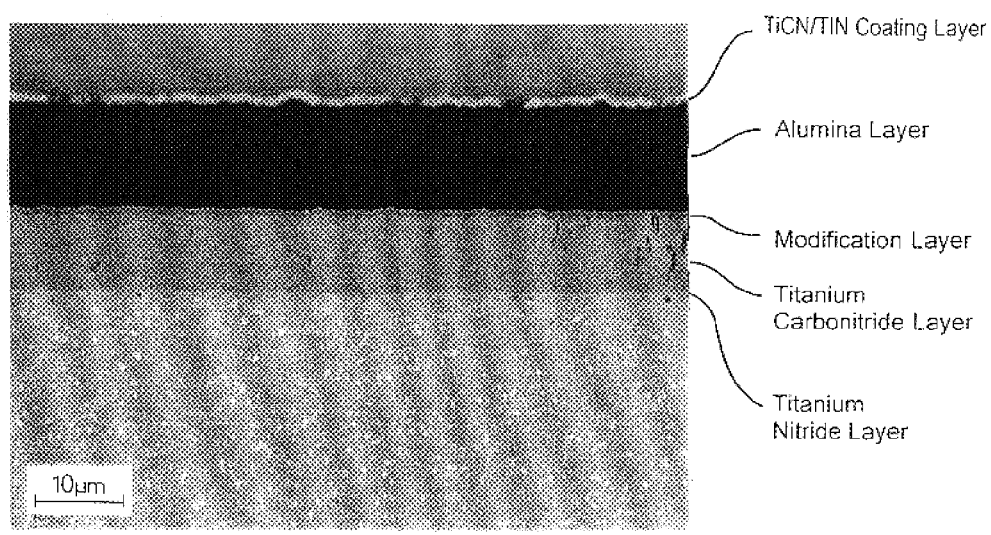
FIG. 3 is a color photomicrograph of one specific embodiment of a coating scheme deposited per Inventive Heat No. 7 and wherein the photomicrograph shows the different coating layers that are identified by reference lines and legends, and the photomicrograph has a 10 micrometer scale thereon.

Referring to FIG. 3, this is a photomicrograph (that has a 10 micrometer scale) that shows the microstructure of the coating scheme at the surface of a cemented (cobalt) tungsten carbide substrate coated according to the process of Inventive Heat No. 7. In this regard, the coating scheme comprises a base coating layer of titanium nitride on the surface of the substrate. The titanium nitride base layer is relatively thin and is goldish in color, and is shown by the reference arrow and corresponding legend. There is an intermediate coating layer of titanium carbonitride applied by chemical vapor deposition to the base coating layer that is relatively thicker and is gray-blue in color and is shown by the reference arrow and the corresponding legend. There is a modification coating layer on the intermediate layer that is relatively thin and goldish in color and is shown by the reference arrow and the corresponding legend. The modification coating layer contains titanium, aluminum, oxygen, carbon and nitrogen in what applicants believe is the compound of titanium aluminum oxycarbonitride (TiAlOCN). There is a coating layer of alpha-alumina applied to the modification coating layer that is relatively thicker and black in color, and is shown by the reference arrow and the corresponding legend. There is an outer coating that is a combination titanium carbonitride and titanium nitride wherein the titanium carbonitride is applied first and then the titanium nitride. The outer layer has a goldish color.

Set forth below in Table 7 are the process parameters for Inventive Heat No. 8, as well as a description of the material that comprises the coating layers. Referring to Table 7, the column identified as "Material" presents the material of the coating layer, the column identified as "Temperature Range" presents the temperature range (or temperature) in degrees Centigrade (° C.) for the process step to deposit the corresponding coating layer, the column identified as "Pressure Range" presents the pressure range (or pressure) in millibars (mb) for the process step to deposit the corresponding coating layer, and the column identified as "Total Time" presents the total duration in minutes for the process step to deposit the corresponding coating layer, and the column identified as "Gases Present" identifies the gases that were present for the process step to deposit the corresponding coating layer. It is expected that the alumina coating layer is a kappa-phase alumina.

TABLE 7

Process Steps for Inventive Heat No. 8

| Material | Temperature Range (° C.) | Pressure Range (mb) | Total Time (Minutes) | Gases Present |
|---|---|---|---|---|
| κ-alumina (MT) | 870-890 | 79 | 240 | $H_2 + AlCl_3 + HCl + CO_2 + H_2S$ |
| κ-alumina (MT) | 870-890 | 79 | 30 | $H_2 + N_2 + AlCl_3 + HCl + CO + CO_2$ |
| Modification Layer | * | * | * | * |
| TiAlOCN | 870-890 | 79 | 15 | $H_2 + N_2 + TiCl_4 + AlCl_3 + HCl + CO + CH_4$ |
| TiOCN | 870-890 | 79 | 15 | $H_2 + N_2 + TiCl_4 + HCl + CO + CH_4$ |
| TiAlOCN | 870-890 | 100 | 15 | $H_2 + N_2 + TiCl_4 + AlCl_3 + HCl + CO + CH_4$ |
| TiOCN | 870-890 | 500 | 20 | $H_2 + N_2 + TiCl_4 + HCl + CO + CH_4$ |
| Modification Layer | * | * | * | * |
| TiCN | 870-890 | 500 | 60 | $H_2$ & $N_2$ & $CH_4$ & $TiCl_4$ |
| TiCN | 870-890 | 100 | 130 | $H_2$ & $N_2$ & $CH_3CN$ & $TiCl_4$ |
| TiN | 870-890 | 158 | 50 | $H_2$ & $N_2$ & $TiCl_4$ |
| SUBSTRATE | | | | |

FIG. 13 is a photomicrograph (a magnification equal to 5000×) that shows the surface of the alumina coating layer of a cemented (cobalt) tungsten carbide substrate coated per Inventive Heat No. 8. The crystalline phase of the alumina coating layer is kappa phase. The kappa-alumina coating layer presents a lenticular grain morphology at the surface thereof.

Figure 14:
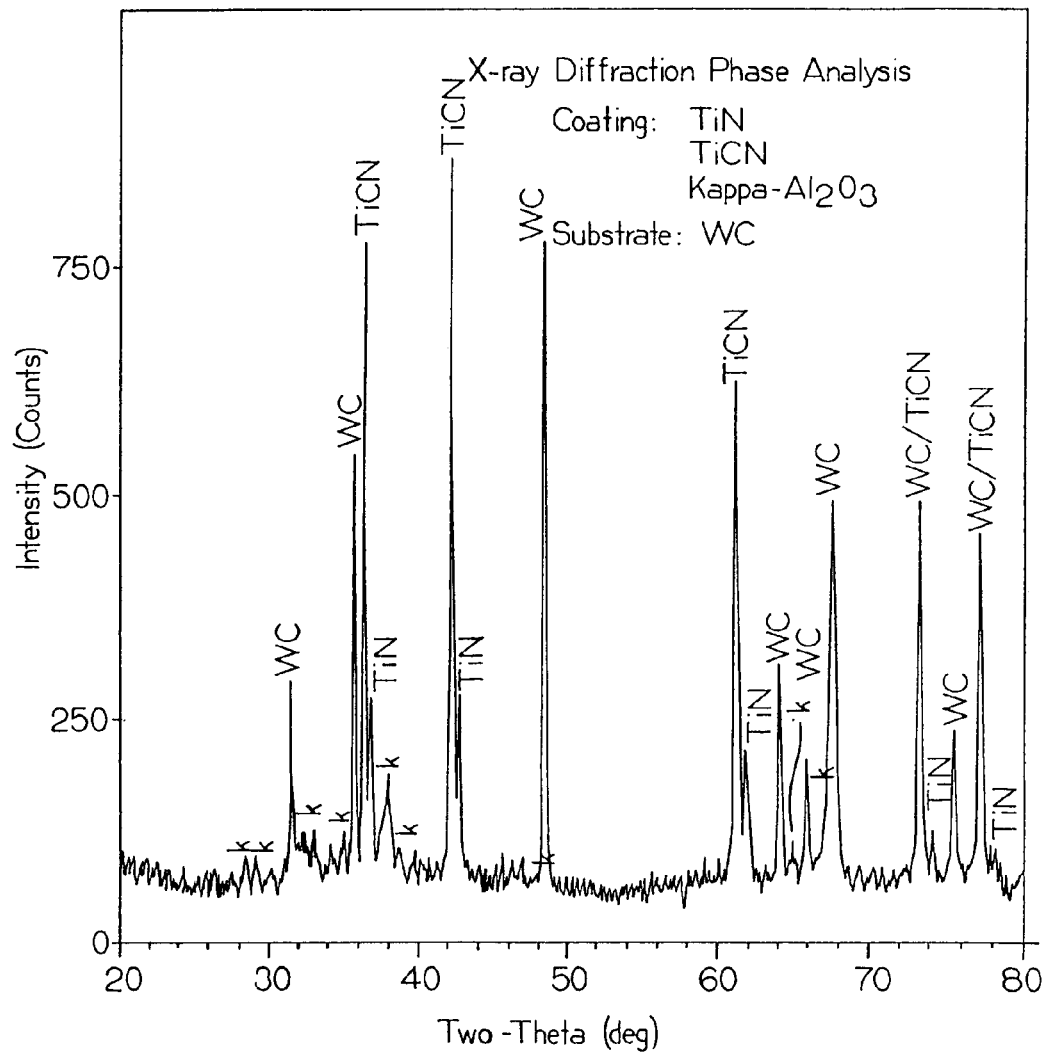
FIG. 14 is an x-ray diffraction pattern for a coated tungsten carbide substrate coated per Inventive Heat No. 8 and wherein the presence of kappa-alumina, tungsten carbide, titanium nitride, and titanium carbonitride are noted by their corresponding peaks.

FIG. 14 is an x-ray diffraction pattern of a coated cemented (cobalt) tungsten carbide substrate coated per the process of Inventive Heat No. 8.

FIG. 14 shows the presence of kappa-alumina, titanium nitride, titanium carbonitride and tungsten carbide as noted by their corresponding peaks.

Figure 15:
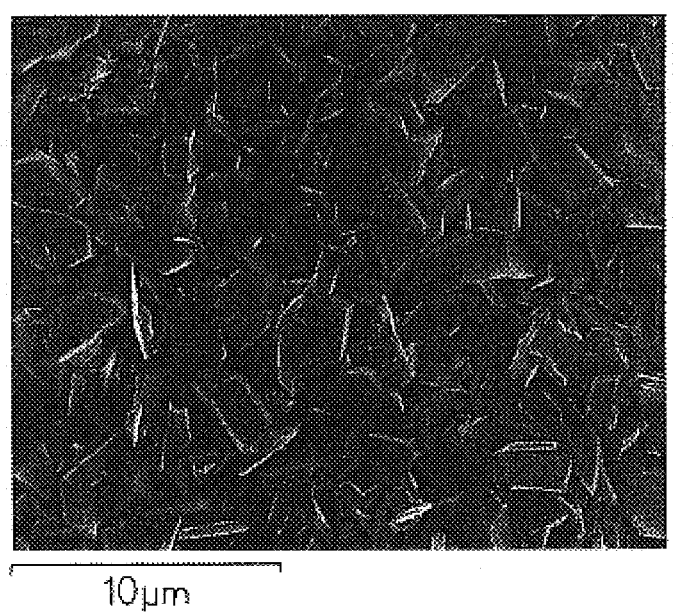
FIG. 15 is a photomicrograph (at a magnification equal to 5000×) of the surface of a prior art kappa-alumina coating deposited on a substrate by high temperature CVD, and wherein the photomicrograph shows that the kappa-alumina coating has a blocky grain morphology at the surface.

FIG. 15 is a SEM photomicrograph (a magnification equal to 15,000×) of the alumina (kappa) coating layer for a prior art high temperature coating process. The kappa-alumina layer was applied at a pressure of about 90 torr and at a temperature within the range of 970° C. to about 1000° C. in a gaseous atmosphere containing HCl and $H_2S$. The high temperature kappa-alumina coating layer shown in FIG. 19 has a blocky morphology at the surface thereof.

Set forth below in Table 8 are the process parameters for Inventive Heat No. 9 as well as a description of the material that comprises the coating layers. Referring to Table 8, the column identified as "Material" presents the material of the coating layer, the column identified as "Temperature Range" presents the temperature range (or temperature) in degrees Centigrade (° C.) for the process step to deposit the corresponding coating layer, the column identified as "Pressure Range" presents the pressure range (or pressure) in millibars (mb) for the process step to deposit the corresponding coating layer, and the column identified as "Total Time" presents the total duration in minutes for the process step to deposit the corresponding coating layer, and the column identified as "Gases Present" identifies the gases that were present for the process step to deposit the corresponding coating layer. It is expected that the crystalline phase of the alumina layer is alpha-phase.

Centigrade) application of titanium carbonitride using the following gases: $H_2$, $N_2$, $TiCl_4$, and $CH_3CH$ followed by the use of $H_2$, $N_2$, $TiCl_4$, and $CH_4$ ; Step 3 is the application (870-890 degrees Centigrade) of titanium oxycarbonitride using either one of the following gas mixtures: (a) $H_2$, $N_2$, $TiCl_4$, $CH_4$ and $CO_2$ or (b) $H_2$, $N_2$, $TiCl_4$, $CH_4$ and CO; Step 4 is the application of moderate temperature (870-890 degrees Centigrade) alumina using the following gases: $H_2$, $N_2$, $AlCl_3$, HCl, CO and $H_2S$; and Step 5 is the application (870-890 degrees Centigrade) of titanium nitride using the following gases: $H_2$, $N_2$, and $TiCl_4$. The alumina coating layer may comprise either alpha alumina or kappa phase alumina or a mixture of alpha phase alumina and kappa phase alumina.

PcBN Coating Scheme No. 2 comprises the following sequential steps: Step 1 is the moderate temperature (870-890 degrees Centigrade) application of titanium carbonitride to the surface of the substrate using the following gases: $H_2$, $N_2$, $TiCl_4$, and $CH_3CH$ followed by the use of $H_2$, $N_2$, $TiCl_4$, and $CH_4$; Step 2 is the application (870-890 degrees Centigrade) of titanium oxycarbonitride using either one of the following gas mixtures: (a) $H_2$, $N_2$, $TiCl_4$, $CH_4$ and $CO_2$ or (b) $H_2$, $N_2$, $TiCl_4$, $CH_4$ and CO; Step 3 is the application (870-890 degrees Centigrade) of titanium aluminum oxycarbonitride

TABLE 8

Process Steps for Inventive Heat No. 9

| Material | Temperature Range (° C.) | Pressure Range (mb) | Total Time (Minutes) | Gases Present |
|---|---|---|---|---|
| α-alumina | 870-890 | 79 | 300 | $H_2 + N_2 + AlCl_3 + HCl + CO + CO_2 + H_2S$ (Higher Rate Deposition) |
| α-alumina | 870-890 | 79 | 150 | $H_2 + N_2 + AlCl_3 + HCl + CO + CO_2 + H_2S$ (Lower Rate Deposition) |
| Modification Layer | * | * | * | * |
| TiOCN | 870-890 | 79 | 15 | $H_2 + N_2 + TiCl_4 + HCl + CO + CH_4$ (Lower $TiCl_4$ content) |
| TiAlOCN | 870-890 | 100 | 15 | $H_2 + N_2 + TiCl_4 + AlCl_3 + HCl + CO + CH_4$ |
| TiOCN | 870-890 | 500 | 20 | $H_2 + N_2 + TiCl_4 + HCl + CO + CH_4$ |
| Modification Layer | * | * | * | * |
| TiCN | 870-890 | 500 | 60 | $H_2$ & $N_2$ & $CH_4$ & $TiCl_4$ |
| TiCN | 850-870 | 100 | 155 | $H_2$ & $N_2$ & $CH_3CN$ & $TiCl_4$ |
| TiN | 870-890 | 158 | 35 | $H_2$ & $N_2$ & $TiCl_4$ |
| SUBSTRATE | | | | |

Inventive Heat No. 10 is essentially the same as Inventive Heat No. 9, except that the substrate coated per Inventive Heat No. 10 was a PcBN substrate. Further, Inventive Heat No. 10 includes a first step to deposit an MT-alumina base layer.

Inventive Heat No. 11 is essentially the same as Inventive Heat No. 7, except that the substrate that is coated per Inventive Heat No. 11 was PcBN, and Inventive Heat No. 11 included a first step to deposit an MT-CVD alumina coating layer.

As mentioned above, as well as shown above in certain ones of the inventive heats, PcBN materials (i.e., substrates) may be coated according to the present invention. In this regard, the following coating schemes may be applied by chemical vapor deposition to a PcBN substrate wherein specific PcBN compositions were disclosed in more detail hereinabove.

PcBN Coating Scheme No. 1 comprises the following sequential steps: Step 1 is the moderate temperature (870-890 degrees Centigrade) application of titanium nitride to the surface of the substrate using the following gases: $H_2$, $N_2$, and $TiCl_4$; Step 2 is the moderate temperature (870-890 degrees using either one of the following gas mixtures: (a) $H_2$, $N_2$, $TiCl_4$, $CH_4$, $AlCl_3$ and $CO_2$ or (b) $H_2$, $N_2$, $TiCl_4$, $AlCl_3$, $CH_4$ and CO; Step 4 is the application of moderate temperature (870-890 degrees Centigrade) alumina using the following gases: $H_2$, $N_2$, $AlCl_3$, HCl, CO and $H_2S$; and Step 5 is the application of titanium nitride using the following gases: $H_2$, $N_2$, and $TiCl_4$; Step 6 is the application ( 870-890 degrees Centigrade) of titanium carbonitride using the following gases: $H_2$, $N_2$, $TiCl_4$, and $CH_3CH$; and Step 7 is the application (870-890 degrees Centigrade) of titanium nitride using the following gases: $H_2$, $N_2$, and $TiCl_4$. The alumina coating layer may comprise either alpha alumina or kappa phase alumina or a mixture of alpha phase alumina and kappa phase alumina.

PcBN Coating Scheme No. 5 comprises the following sequential steps: Step 1 is the moderate temperature application (870-890 degrees Centigrade) of titanium nitride to the surface of the substrate using the following gases: $H_2$, $N_2$, and $TiCl_4$; Step 2 is the moderate temperature application (870-890 degrees Centigrade) of titanium carbonitride using the following gases: $H_2$, $N_2$, $TiCl_4$, and $CH_3CH$ followed by the use of $H_2$, $N_2$, $TiCl_4$, and $CH_4$; Step 3 is the application (870-890 degrees Centigrade) of titanium oxycarbonitride using either one of the following gas mixtures: (a) $H_2$, $N_2$, $TiCl_4$, $CH_4$ and $CO_2$ or (b) $H_2$, $N_2$, $TiCl_4$, $CH_4$ and CO; Step 4 is the application (870-890 degrees Centigrade) of titanium aluminum oxycarbonitride using either one of the following gas mixtures: (a) $H_2$, $N_2$, $TiCl_4$, $CH_4$, $AlCl_3$ and $CO_2$ or (b) $H_2$, $N_2$, $TiCl_4$, $AlCl_3$, $CH_4$ and CO; Step 5 is the moderate temperature application (870-890 degrees Centigrade) of alpha-alumina using the following gases: $H_2$, $N_2$, $AlCl_3$, HCl, CO and $H_2S$; Step 6 is the application (870-890 degrees Centigrade) of titanium nitride using the following gases: $H_2$, $N_2$, and $TiCl_4$; Step 7 is the application (870-890 degrees Centigrade) of titanium carbonitride using the following gases: $H_2$, $N_2$, $TiCl_4$, and $CH_3CH$; and Step 8 is the application (870-890 degrees Centigrade) of titanium nitride using the following gases: $H_2$, $N_2$, and $TiCl_4$. The alumina coating layer comprises kappa phase alumina (with a trace of alpha phase alumina).

PcBN Coating Scheme No. 4 comprises the following sequential steps: Step 1 is the moderate temperature application (870-890 degrees Centigrade) of titanium nitride to the surface of the substrate using the following gases: $H_2$, $N_2$, and $TiCl_4$; Step 2 is the moderate temperature application (870-890 degrees Centigrade) of titanium carbonitride using the following gases: $H_2$, $N_2$, $TiCl_4$, and $CH_3CH$ followed by the use of $H_2$, $N_2$, $TiCl_4$, and $CH_4$; Step 3 is the application (870-890 degrees Centigrade) of titanium oxycarbonitride using the following gases $H_2$, $N_2$, $TiCl_4$, $CH_4$, and $CO_2$; Step 4 is the application (870-890 degrees Centigrade) of titanium aluminum oxycarbonitride using the following gases $H_2$, $N_2$, $TiCl_4$, $CH_4$, $AlCl_3$ and $CO_2$; and Step 5 is the moderate temperature application (870-890 degrees Centigrade) of alumina using the following gases: $H_2$, $N_2$, $AlCl_3$, HCl, CO and $H_2S$. The alumina coating layer may comprise either alpha alumina or kappa phase alumina or a mixture of alpha phase alumina and kappa phase alumina.

The above-mentioned coating schemes are suitable for coating PcBN materials of PcBN Compositions Nos. 1 and 2. To best coat PcBN materials PcBN Compositions Nos. 3 and 4, the surface of the substrate is subjected to a gaseous etch of $AlCl_3$ and then a layer of alumina is applied before starting any one of PcBN Coating Schemes Nos. 1, 3 and 4 as described above. In testing, the PcBN Coating Scheme No. 2 appears to have provided the best results.

Tests were conducted to compare the relative wear of selected ones of the specific inventive coated cutting insert against conventional coated cutting inserts. Table 9 below sets forth the relative wear results for the cutting of G2 pearlitic cast iron (hardness between 8 to 27.6 HRC) under the following conditions: speed of 2000 surface feet per minute (655.7 surface meters per minute), a feed equal to 0.015 inches per revolution (0.38 millimeters per revolution) and a depth of cut (DOC) of 0.050 inches (1.27 millimeters). The cutting insert style was either a CNGA432S0420MT or CNGA433S0420MT at a −5 degrees lead angle.

TABLE 9

Test results for Cutting of G2 Pearlitic Cast Iron

| Sample | Wear Comparison Wet | Wear Comparison Dry | Crystalline Phase(s) of Alumina Coating Layer |
|---|---|---|---|
| Uncoated PcBN | 1 | 1 | Not Applicable |
| PcBN Substrate Coated with Conventional PCD Coating at 1000° C. | 0.7 | 1.7 | Blocky alpha alumina coating |
| PcBN Substrate with the Coating of Inventive Heat No. 5 | 2.4 | 2.8 | Kappa alumina (with a trace of alpha phase alumina) coating |
| PcBN Substrate with the Coating of Inventive Heat No. 4 | 1.4 | Not Tested | Alpha-kappa alumina |

The test results of Table 9 show that each embodiment of a PcBN cutting insert coated per an inventive process exhibited improved performance over a conventionally coated PcBN cutting insert. In this regard, the PcBN cutting insert coated per Inventive Heat No. 5 demonstrated over three times the wear resistance than the conventionally coated cutting insert and the PcBN insert coated per Inventive Heat No. 4 exhibited twice the wear resistance of the conventionally coated cutting insert when cutting with coolant.

A PcBN cutting insert coated by a physical vapor deposition technique (PVD) with titanium aluminum nitride did not perform as good as the uncoated PcBN cutting insert in the cutting of G2 pearlitic cast iron in a test separate from the tests of Table 9.

Additional tests were conducted to compare the relative war of the certain ones of the specific examples of the inventive coated cutting inserts against conventional coated cutting inserts. Table 10 below sets forth the relative wear results for the cutting of G2 pearlitic cast iron (hardness between 8 to 27.6 HRC) under the following conditions: speed of 2000 surface feet per minute (655.7 surface meters per minute), a feed equal to 0.009 inches per revolution (0.229 millimeters per revolution) and a depth of cut (DOC) of 0.040 inches (1.02 millimeters). The cutting was done with a coolant. The cutting insert style was a SNGA432S0420MT with a 15 degree lead angle, except for the PcBN substrate with the coating of Inventive Heat No. 4 which was style SNGA432S0820MT.

TABLE 10

Test results for Cutting of G2 Pearlitic Cast Iron

| Sample | Wear Comparison Wet | Crystalline Phase(s) of Alumina Coating Layer |
|---|---|---|
| Uncoated PcBN Substrate | 1 | |
| PcBN Substrate Coated with Conventional PCD Coating at 1000° C. | 1.7 | alpha alumina |
| PcBN Substrate with the Coating of Inventive Heat No. 5 | 2.9 | Kappa alumina (with a trace of alpha phase alumina) |
| PcBN Substrate with the Coating of Inventive Heat No. 4 | 1.9 | alpha-kappa alumina |

TABLE 10-continued

Test results for Cutting of G2 Pearlitic Cast Iron

| Sample | Wear Comparison Wet | Crystalline Phase(s) of Alumina Coating Layer |
|---|---|---|
| PcBN Substrate with the Coating of Inventive Heat No. 8 | 3.3 | kappa alumina |
| PcBN Substrate with the Coating of Inventive Heat No. 9 | 2.7 | alpha alumina |

The test results of Table 10 show that each embodiment of a PcBN cutting insert coated per an inventive process exhibited improved performance over a conventionally coated PcBN cutting insert. In this regard, the PcBN cutting insert coated by Inventive Heat No. 8 exhibited almost twice the wear resistance of the conventionally coated PcBN cutting insert. In addition, PcBN cutting inserts coated per Inventive Heats Nos. 5, 9 and 4 showed improved wear resistance of about 70 percent, 59 percent and 12 percent, respectfully, over the conventionally coated PcBN cutting insert.

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A coated body comprising:
   a substrate;
   a coating scheme on the substrate wherein the coating scheme includes an alpha-alumina coating layer that exhibits a platelet grain morphology at the surface of the alpha-alumina coating layer; and
   the coating scheme including a modification coating layer applied by chemical vapor deposition wherein the modification coating layer includes oxygen and aluminum and one or more of carbon and nitrogen and one or more of the Group IVB elements of the Periodic Table; the alpha-alumina coating layer being applied on the modification coating layer; and the coating scheme further including an intermediate coating layer containing a carbonitride of one or more of a Group IVB element of the Periodic Table applied by chemical vapor deposition, and the modification coating layer being applied on the intermediate coating layer; and the coating scheme further including a base coating layer on the substrate, and the intermediate coating layer being applied on the base coating layer.

2. The coated body of claim 1 wherein the alpha-alumina coating layer being applied by chemical vapor deposition at a temperature ranging between about 750 degrees Centigrade and 920 degrees Centigrade.

3. The coated body of claim 1 wherein the base coating layer contains a nitride of one or more of a Group IVB element of the Periodic Table applied by chemical vapor deposition to the substrate.

4. The coated body of claim 1 wherein the substrate comprises one of the following: a cemented carbide, a ceramic, a cermet and a polycrystalline cubic boron nitride.

5. The coated body of claim 1 wherein the coated body comprises a coated cutting insert, and the coated cutting insert having a rake surface and a flank surface, and a cutting edge at the juncture of the rake surface and the flank surface.

6. The coated body of claim 1 wherein the coating scheme further including one or more coating layers on the alpha-alumina coating layer.

7. The coated body of claim 1 wherein the base coating layer comprising alumina.

8. A coated body comprising:
   a substrate; and
   a coating scheme on the substrate wherein the coating scheme includes a kappa-alumina coating layer that exhibits either a lenticular grain morphology or a polyhedra-lenticular grain morphology at the surface of the kappa-alumina coating layer.

9. The coated body of claim 8 wherein the kappa-alumina coating layer being applied by chemical vapor deposition at a temperature ranging between about 750 degrees Centigrade and 920 degrees Centigrade.

10. The coated body of claim 8 wherein the coating scheme further including a modification coating layer applied by chemical vapor deposition wherein the modification coating layer includes oxygen and aluminum and one or more of carbon and nitrogen and one or more of the Group IVB elements of the Periodic Table; and the kappa-alumina coating layer being applied on the modification coating layer; and the coating scheme further including an intermediate coating layer containing a carbonitride of one or more of a Group IVB element of the Periodic Table applied by chemical vapor deposition, and the modification coating layer being applied on the intermediate coating layer, and the coating scheme further including a base coating layer containing a nitride of one or more of a Group IVB element of the Periodic Table applied by chemical vapor deposition to the substrate, and the intermediate coating layer being applied on the base coating layer.

11. The coated body of claim 8 wherein the substrate comprises one of the following: a cemented carbide, a ceramic, a cermet and a polycrystalline cubic boron nitride.

12. The coated body of claim 8 wherein the coated body comprises a coated cutting insert, and the coated cutting insert having a rake surface and a flank surface, and a cutting edge at the juncture of the rake surface and the flank surface.

13. The coated body of claim 8 wherein the coating scheme further including one or more coating layers on the kappa-alumina coating layer.

14. The coated body of claim 8 wherein the coating scheme including a base coating layer of alumina on the substrate.

15. A coated body comprising:
   a substrate; and
   a coating scheme on the substrate wherein the coating scheme includes a kappa-alpha alumina coating layer that contains alpha-alumina and kappa-alumina, and wherein the kappa-alpha coating layer exhibits either a large multifaceted grain morphology or a polyhedra-multifaceted grain morphology at the surface of the alumina coating layer.

16. The coated body of claim 15 wherein the kappa-alpha Alumina coating layer being applied by chemical vapor deposition at a temperature of ranging between about 750 degrees Centigrade and 920 degrees Centigrade.

17. The coated body of claim 15 wherein the coating scheme further including a modification coating layer applied by chemical vapor deposition wherein the modification coating layer includes oxygen and aluminum and one or more of carbon and nitrogen and one or more of the Group IVB elements of the Periodic Table; and the kappa-alpha alumina coating layer being applied on the modification coating layer;

and the coating scheme further including an intermediate coating layer containing a carbonitride of one or more of a Group IVB element of the Periodic Table applied by chemical vapor deposition, and the modification coating layer being applied on the intermediate coating layer, and the coating scheme further including a base coating layer containing a nitride of one or more of a Group IVB element of the Periodic Table applied by chemical vapor deposition to the substrate, and the intermediate coating layer being applied on the base coating layer.

18. The coated body of claim 15 wherein the substrate comprises one of the following: a cemented carbide, a ceramic, a cermet and a polycrystalline cubic boron nitride.

19. The coated body of claim 15 wherein the coated body comprises a coated cutting insert, and the coated cutting insert having a rake surface and a flank surface, and a cutting edge at the juncture of the rake surface and the flank surface.

20. The coated body of claim 15 wherein the coating scheme further including one or more coating layers on the kappa-alpha alumina coating layer.

21. The coated body of claim 15 wherein the coating scheme including a base coating layer of alumina on the substrate.

22. A coated body comprising:
a substrate; and
a coating scheme on the substrate wherein the coating scheme includes an alumina coating layer selected from the group comprising an alpha-alumina coating layer having a platelet grain morphology at the surface thereof and a kappa-alumina coating layer having either a lenticular grain morphology at the surface thereof or a polyhedra-lenticular grain morphology at the surface thereof and a kappa-alpha-alumina coating layer having either a large multifaceted grain morphology at the surface thereof or a polyhedra-multifacted grain morphology at the surface thereof, and the coating layer being applied by chemical vapor deposition at a temperature ranging between about 750 degrees Centigrade and less than about 850 degrees Centigrade.

23. The coated body of claim 22 wherein the alumina coating layer comprises alpha alumina.

24. The coated body of claim 22 wherein the alumina coating layer comprises kappa alumina.

25. The coated body of claim 22 wherein the alumina coating layer comprises alpha-kappa alumina coating layer.

26. A coated body comprising:
a substrate comprising polycrystalline cubic boron nitride; and
a coating scheme on the substrate wherein the coating scheme comprises an alumina coating layer wherein the alumina coating layer is one of the following:
an alpha-alumina coating layer having a platelet grain morphology at the surface thereof, or
a kappa-alumina coating layer having either a lenticular grain morphology at the surface thereof or a polyhedra-lenticular grain morphology at the surface thereof, or
an alpha-kappa-alumina coating layer having either a large multifaceted grain morphology at the surface thereof or a polyhedra-multifacted grain morphology at the surface thereof; and
the coating scheme further includes a base coating layer of alumina applied to the substrate.

* * * * *